United States Patent [19]
Hatori et al.

[11] Patent Number: 5,539,331
[45] Date of Patent: Jul. 23, 1996

[54] FIELD PROGRAMMABLE GATE ARRAY HAVING TRANSMISSION GATES AND SEMICONDUCTOR INTEGRATED CIRCUIT FOR PROGRAMMING CONNECTION OF WIRES

[75] Inventors: Fumitoshi Hatori, Tachikawa; Kazutaka Nogami, Yokohama; Takayasu Sakurai, Setagaya-ku; Makoto Ichida, Yokohama, all of Japan

[73] Assignee: Kabushiki Kaisha Toshiba, Tokyo, Japan

[21] Appl. No.: 237,631

[22] Filed: May 4, 1994

[30] Foreign Application Priority Data

May 10, 1993 [JP] Japan ................................. 5-132608

[51] Int. Cl.$^6$ ........................ H01L 25/00; H03K 19/177
[52] U.S. Cl. ............................................. 326/41; 326/113
[58] Field of Search .............................. 307/465, 465.1, 307/469; 326/38, 39, 41, 45, 47, 50, 113

[56] References Cited

U.S. PATENT DOCUMENTS

| | | | |
|---|---|---|---|
| 4,523,106 | 6/1985 | Tanizawa et al. | 307/303 |
| 4,899,067 | 2/1990 | So et al. | 307/465 |
| 4,910,417 | 3/1990 | El Gamal et al. | 307/465 |
| 4,931,946 | 6/1990 | Ravindra et al. | 364/490 |
| 5,039,883 | 8/1991 | On | 307/465 |
| 5,233,539 | 8/1993 | Agrawal et al. | 364/489 |

Primary Examiner—Edward P. Westin
Assistant Examiner—Stephen Calogero
Attorney, Agent, or Firm—Loeb & Loeb

[57] ABSTRACT

A field programmable gate array comprises: a first wire group (8) composed of a plurality of first wires; a second wire group (7) composed of a plurality of second wires; switching sections (9) provided at least one intersection between the first and second wires of the first and second wire groups (8, 7), for determining connection and disconnection between both when programmed; and a basis cell (6B) having a first transmission gate (4) turned on in response to a high gate voltage and a second transmission gate (5) turned on in response to a low gate voltage, gates of the first and second transmission gates (4, 5) being connected to each other as a common gate or being connectable to each other as a common gate by the switching sections when programmed, input and output terminals and the common gates of the first and second transmission gates (4, 5) being connected to any of the first wires of the first wire group (8), respectively. Wiring of different lengths is provided for connecting circuit elements within the field programmable gate array, with wires of a first length being more numerous than wires of a second, longer length. The quantity of wires of different lengths varies in accordance with the −2.5 power of the length of the wires.

10 Claims, 26 Drawing Sheets

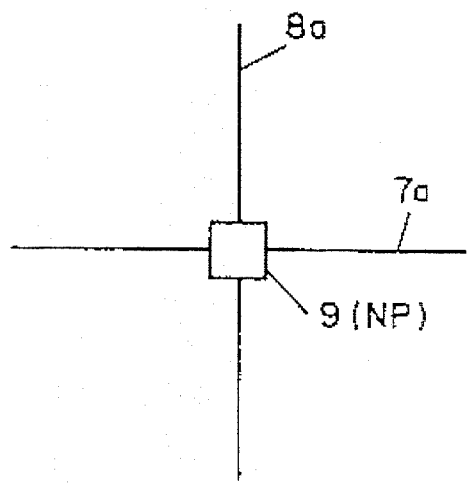
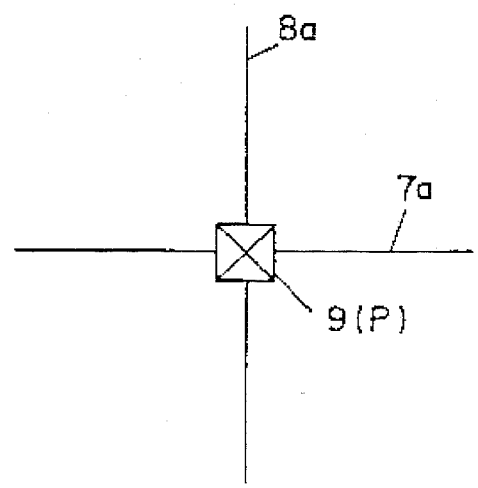
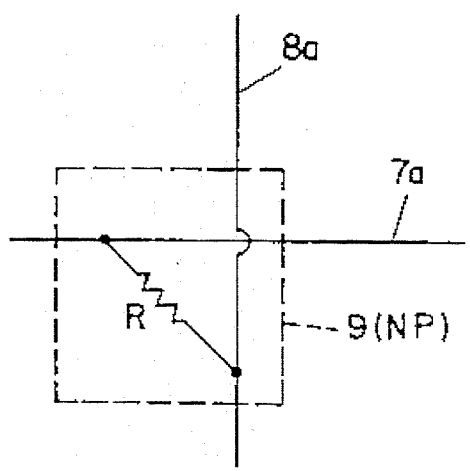
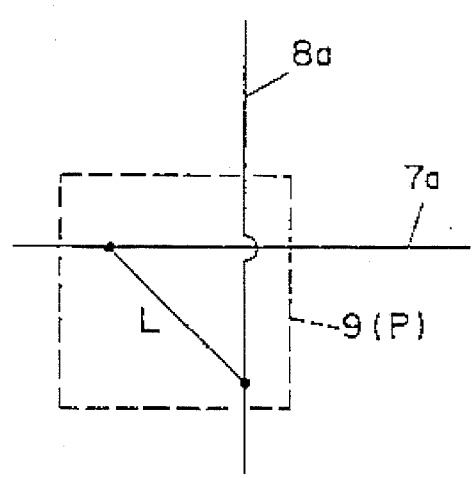
FIG. 4(a)    FIG. 4(b)

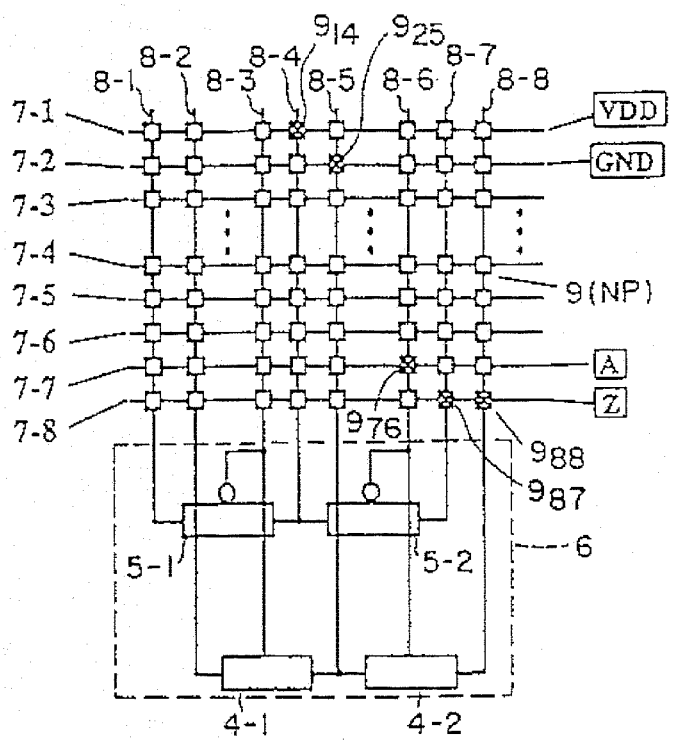
FIG. 5(a)
FIG. 5(b)
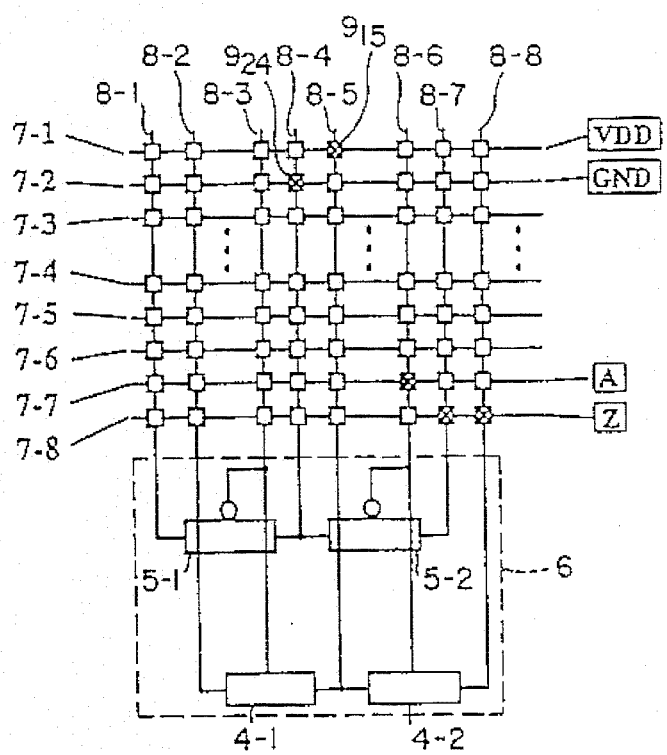
FIG. 6(a)
FIG. 6(b)

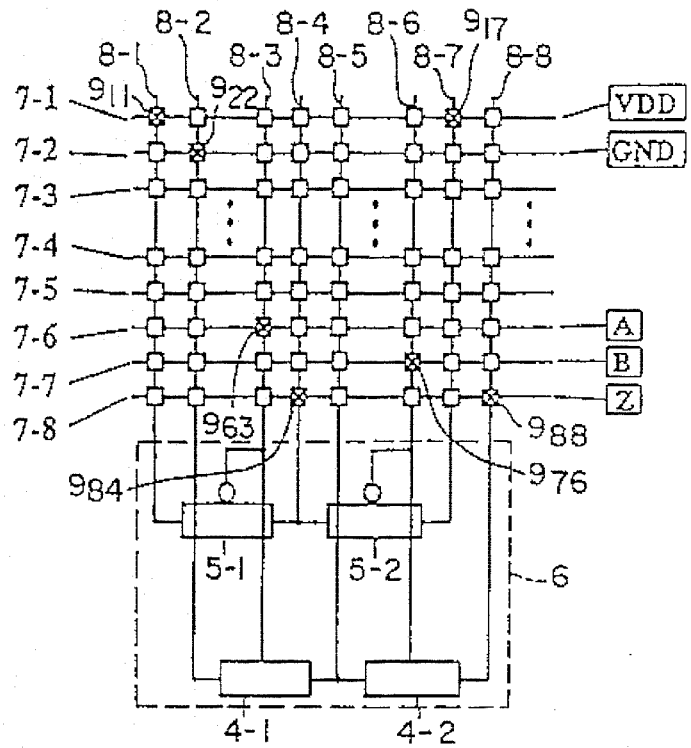
FIG. 7(a)
| A | B | Z |
|---|---|---|
| 0 | 0 | 1 |
| 0 | 1 | 1 |
| 1 | 0 | 1 |
| 1 | 1 | 0 |
FIG. 7(b)
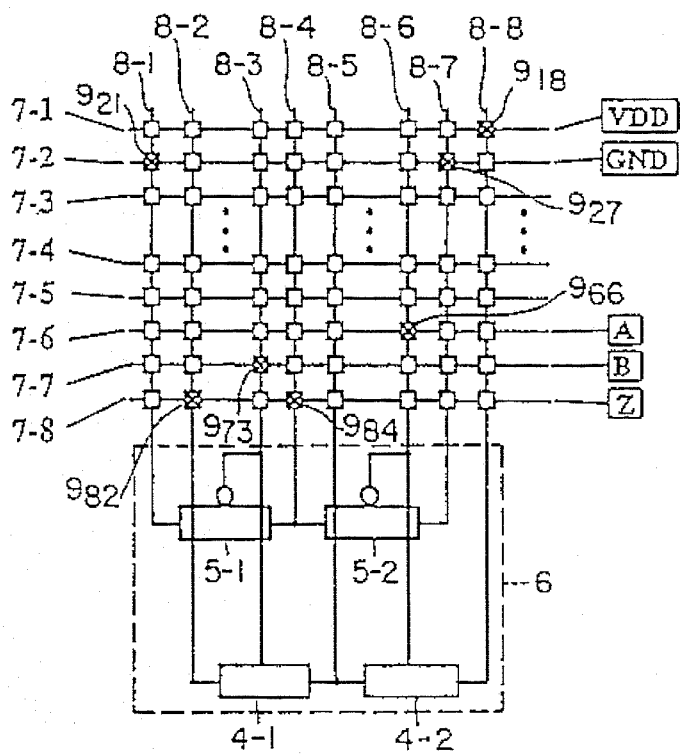
FIG. 8(a)
| A | B | Z |
|---|---|---|
| 0 | 0 | 0 |
| 0 | 1 | 0 |
| 1 | 0 | 0 |
| 1 | 1 | 1 |
FIG. 8(b)

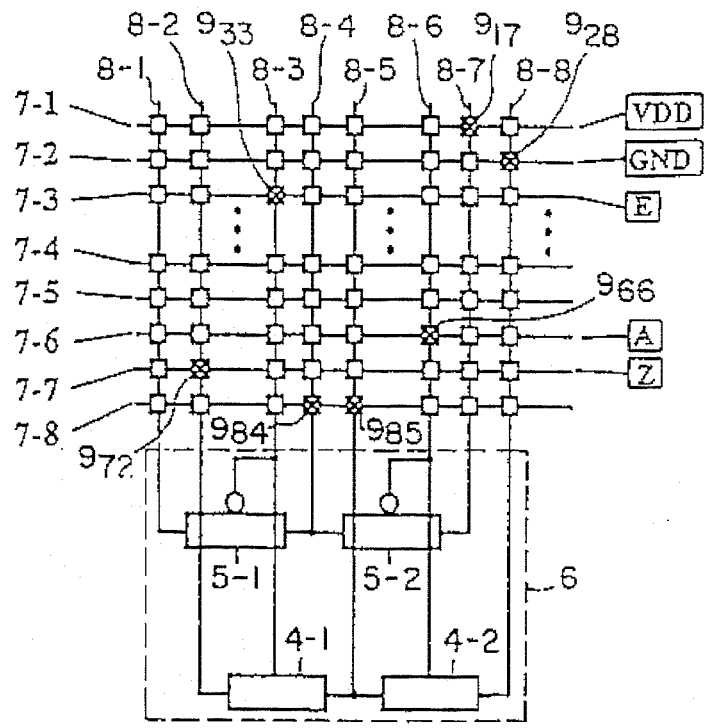
FIG. 9(a)
FIG. 9(b)
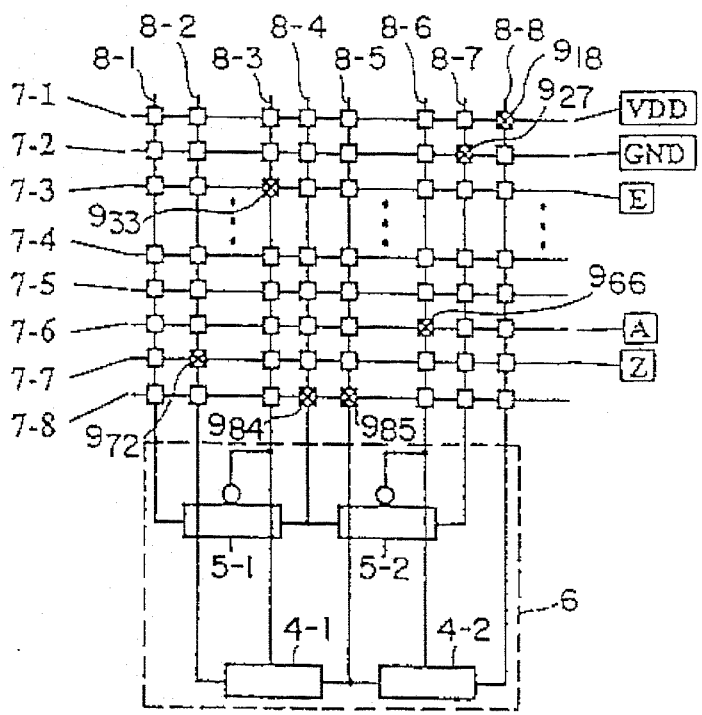
FIG. 10(a)
FIG. 10(b)

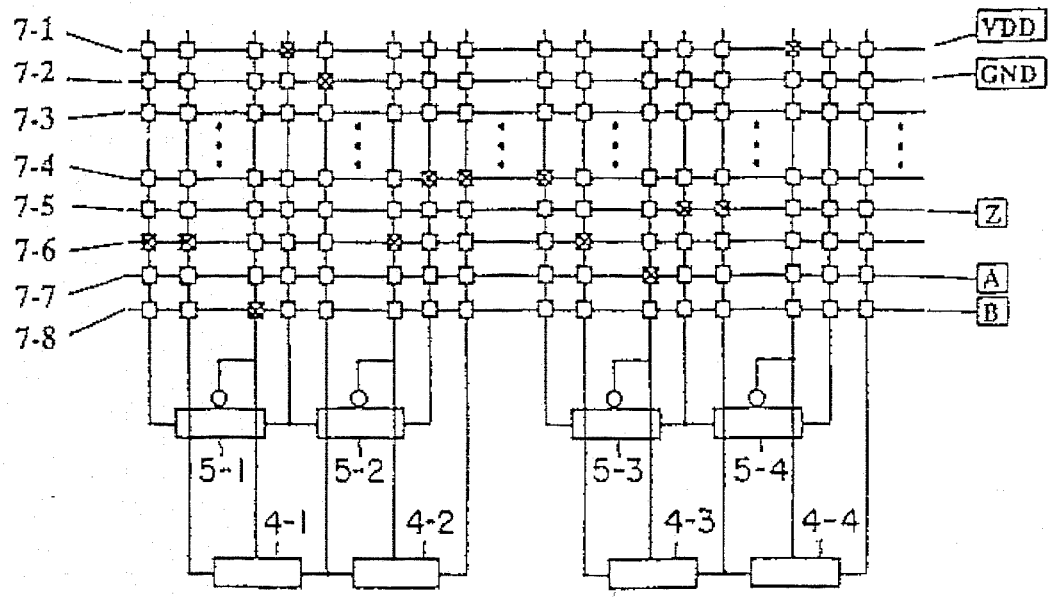
FIG. 11(a)
| A | B | Z |
|---|---|---|
| 0 | 0 | 0 |
| 0 | 1 | 1 |
| 1 | 0 | 1 |
| 1 | 1 | 0 |
FIG. 11(b)
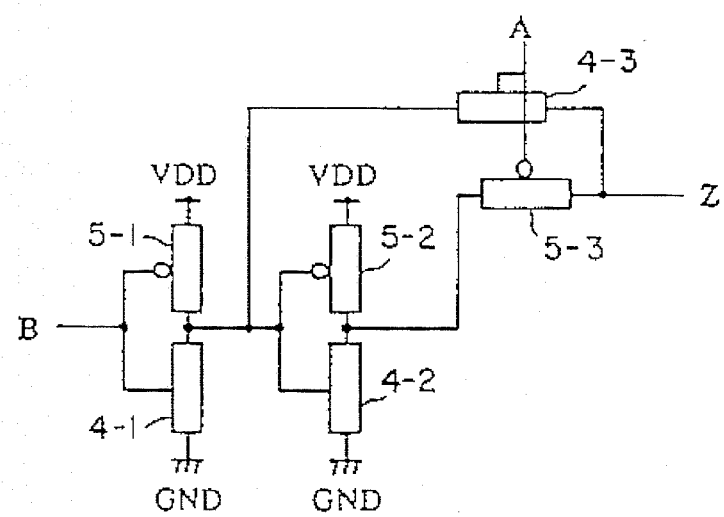
FIG. 11(c)

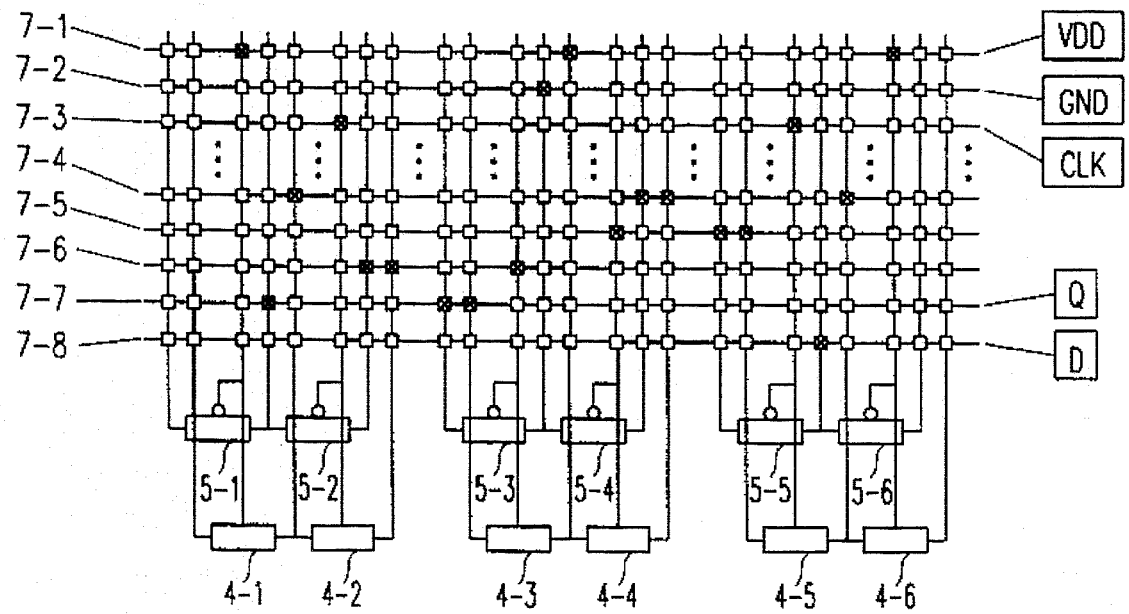
FIG. 12(a)
| D | CLK | $Q_{n+1}$ |
|---|-----|-----------|
| 0 | ↑ | 0 |
| 1 | ↑ | 1 |
| * | ↓ | $Q_n$ |
FIG. 12(b)
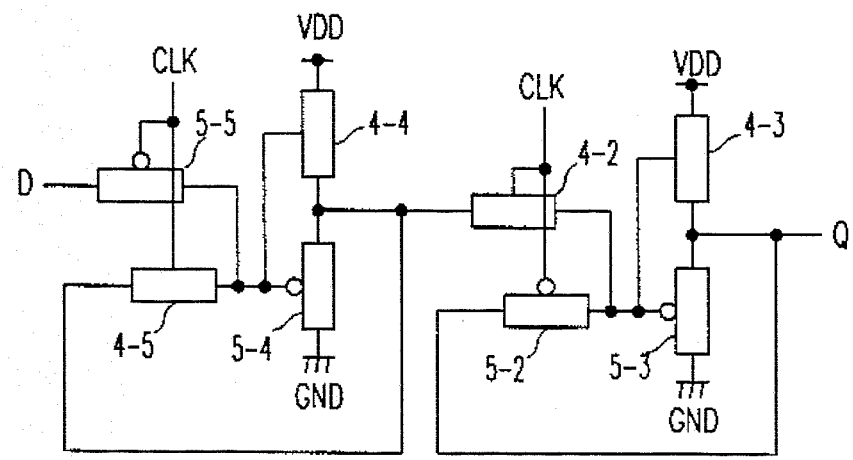
FIG. 12(c)

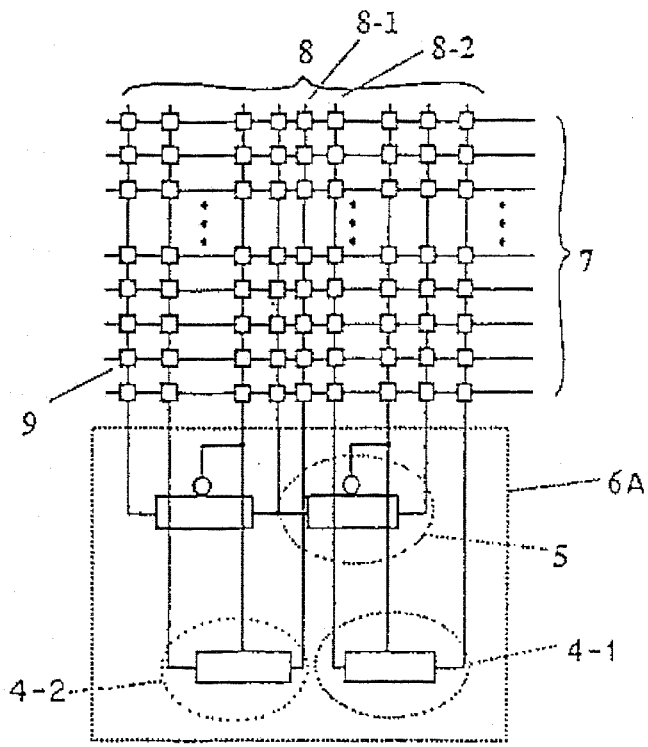
FIG. 13
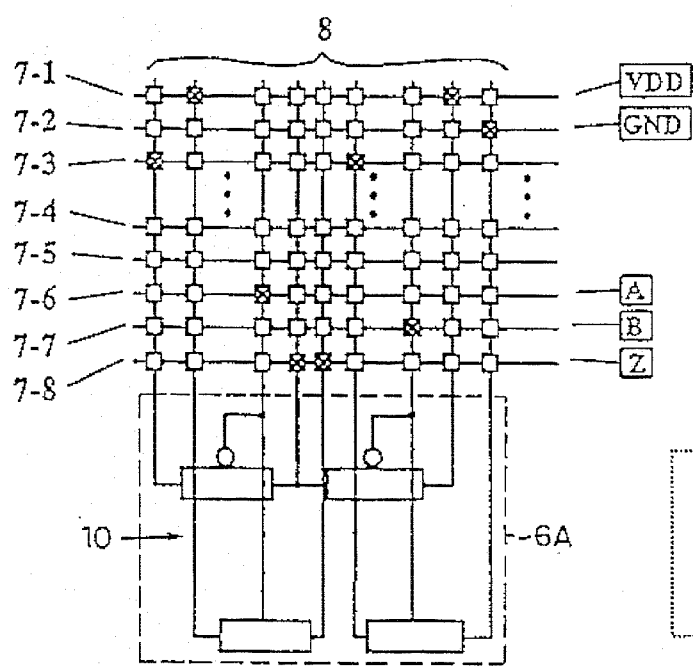
FIG. 14(a)
| A | B | Z |
|---|---|---|
| 0 | 0 | 1 |
| 0 | 1 | 0 |
| 1 | 0 | 1 |
| 1 | 1 | 1 |
FIG. 14(b)
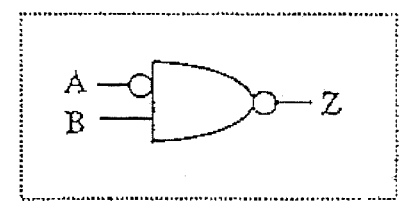
FIG. 14(c)

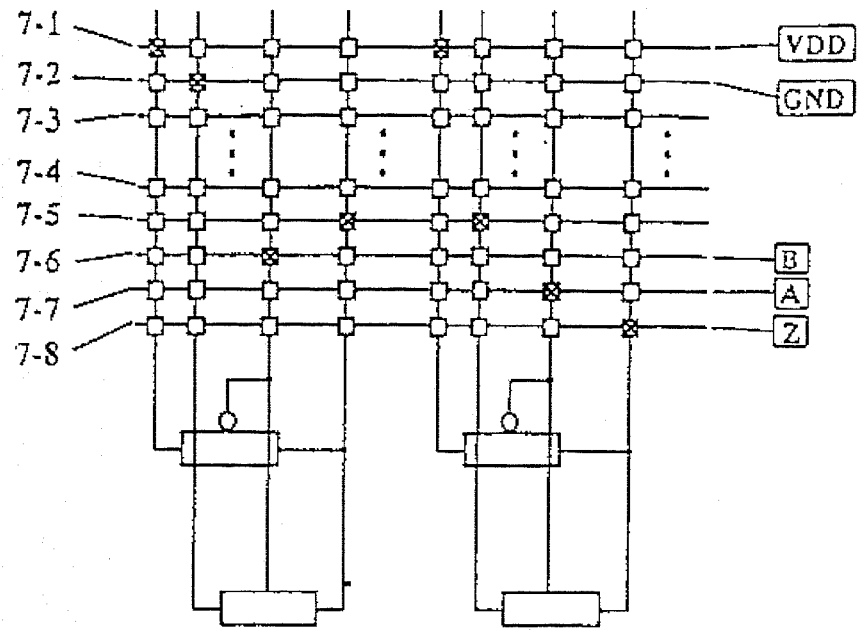
FIG. 18(a)
| A | B | Z |
|---|---|---|
| 0 | 0 | 1 |
| 0 | 1 | 1 |
| 1 | 0 | 1 |
| 1 | 1 | 0 |
FIG. 18(b)
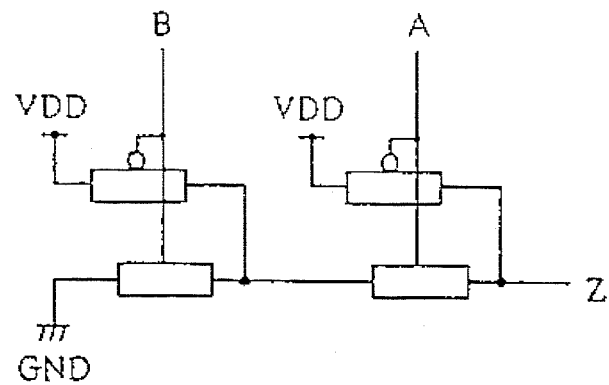
FIG. 18(c)

| IN 1 | IN 2 | A | B | C | D |
|---|---|---|---|---|---|
| 0 | 0 | 1 | 0 | 0 | 0 |
| 0 | 1 | 0 | 1 | 0 | 0 |
| 1 | 0 | 0 | 0 | 1 | 0 |
| 1 | 1 | 0 | 0 | 0 | 1 |

| IN 1 | IN 2 | IN 3 | IN 4 | Q | Q̄ |
|---|---|---|---|---|---|
| 0 | 0 | 0 | 0 | 0 | 1 |
| 0 | 0 | 0 | 1 | 1 | 0 |
| 0 | 0 | 1 | 0 | 1 | 0 |
| 0 | 0 | 1 | 1 | 0 | 1 |
| 0 | 1 | 0 | 0 | 1 | 0 |
| 0 | 1 | 1 | 0 | 0 | 1 |
| 0 | 1 | 0 | 1 | 0 | 1 |
| 0 | 1 | 1 | 1 | 1 | 0 |
| 1 | 0 | 0 | 0 | 1 | 0 |
| 1 | 0 | 0 | 1 | 0 | 1 |
| 1 | 0 | 0 | 1 | 0 | 1 |
| 1 | 0 | 1 | 0 | 1 | 0 |
| 1 | 0 | 1 | 1 | 0 | 1 |
| 1 | 1 | 0 | 0 | 0 | 1 |
| 1 | 1 | 0 | 1 | 1 | 0 |
| 1 | 1 | 1 | 0 | 1 | 0 |
| 1 | 1 | 1 | 1 | 0 | 1 |

"0" = GND
"1" = $V_{DD}$

_5,539,331_

FIELD PROGRAMMABLE GATE ARRAY HAVING TRANSMISSION GATES AND SEMICONDUCTOR INTEGRATED CIRCUIT FOR PROGRAMMING CONNECTION OF WIRES

FIELD OF THE INVENTION

The present invention relates to a field programmable gate array (FPGA) and the semiconductor integrated circuit thereof.

BACKGROUND OF THE INVENTION

The circuits using a programmable array have been developed as ASIC (application specified ICs), that is, as small-quantity products or trial products. Conventionally, the typical circuits using the programmable array are GAs (gate arrays) and SCs (standard cells) customized from the mask level so as to satisfy the specifications required by the user, or PLAs (programmable logic arrays) customized by the user itself. In the case of the SCs, logic circuit blocks used in an LSI(Large Scale Integration) are previously registered in a computer, and products required by the user are designed by arranging and connecting these logic circuit blocks through the automatic processing by use of the computer. Further, in the case of the GAs, basic circuits for constituting logic gates are previously formed into an array pattern on a semiconductor substrate, and the user manufactures any desired LSI by deciding the wiring pattern using an automatic wiring software in the same way as with the case of the standard cells. The above-mentioned methods have such advantages that the period required for development is relatively short, as compared with the ordinary LSI which is totally designed from the beginning. In these methods, however, there still exists a problem in that it takes several weeks or several months from the design end to the production completion, because the manufacturing process is still required after the user has finished the design by the automatic wiring software. In other words, in the case of the GAs and SCs, although there exists such an advantage that any required circuits can be realized, a long development period is needed and thereby the development cost is relatively higher than that of the PLAs. In contrast with this, in the case of the PLAs, although the cost is low and the development period is short, there exists a limit in the actually realizable circuits.

To overcome the shortcomings involved in both the circuit devices, recently, a circuit device referred to as FPGA (field programmable gate array) has been developed, by which any given circuits (as with the case of the GAs) can be developed by the user (as with the case of the PLAs). In this FPGA, there are previously arranged basic cells (each composed of a single of or a plurality of transistors), interconnections for connecting these basic cells, and programmable elements, so that any desired circuits can be obtained by the user by programming these programmable elements. As this circuit device, various devices provided with different programmable elements and different basic cells are now being developed.

FIGS. 26 and 27 show examples of the FPGA cells so far known. In the case of the device shown in FIG. 26, programmable elements 102a and 102b are arranged around a multiplexer 101, and any logic with respect to any number of input signals (e.g., three input signals in FIG. 26) can be stored as a table. In this FPGA cell, any required circuit can be realized as follows: in order to store a logic according to the three input signals IN1, IN2 and IN3 in the multiplexer 101 as a table, the data input terminals of the multiplexer 101 are so designed as to be fixed to a VDD level or a GND level by use of the programmable elements 102a and 102b. Therefore, when the user programs these programmable elements, it is possible to store the outputs of any desired logic according to all the input patterns of the input signals. Consequently, when the input signal lines IN1, IN2 and IN3 are connected to the control input terminals of the multiplexer 101, the multiplexer 101 can output the output signals on the output terminal OUT in accordance with the input signals applied thereto and the logic table stored therein.

In the case of the device shown in FIG. 27, programmable elements 102a and 102b are arranged at the respective nodes of unit transistors 104 and 105. Therefore, by programming the programmable elements 102a and 102b, it is possible to construct a desired circuit by the unit transistors, as with the case of the GA.

In the case where the multiplexer is used, although there exists such an advantage that any given logic circuits can be realized, there exists such a drawback that the efficiency of cell utilization is reduced according to the logic circuits required to be realized. On the other hand, in the case of the unit transistors, although the efficiency of the cell utilization is high, there exist such problems in that: since a floating capacitance is added to the node of each of the transistors, the operating speed decreases; and further since the number of the programmable elements increases, a stand-by current of the device increases due to leak current of the programmable elements.

Further, the FPGA is one of the semiconductor integrated circuits, in which the interconnections between plural cells can be designed by the user. Therefore, it is desirable to prepare a necessary number of interconnections of a required length so that the user can design a desired circuit. In the conventional integrated circuits, however, there exists no definite rule with respect to the interconnection length distribution on which the interconnecting resources are to be decided. Consequently, in FPGAs whenever the user designs the interconnections in practice, there exists a problem in that the inerconnection length is excessive and thereby some regions of the basic circuits are wasteful or conversely the interconnection length is not sufficient.

In summary, the conventional FPGA involves such drawbacks that the efficiency of cell utilization is low; the operating speed is low; the stand-by current is high, etc. In addition, in the integrated circuits whose interconnection can be designed by the user, the interconnecting resources are excessively long and wasteful or insufficiently short, with the result that the effective utilization of the chip area cannot be realized.

SUMMARY OF THE INVENTION

With these problems in mind, therefore, it is the object of the present invention to provide a field programmable gate array high in both operating speed and utilization efficiency; and an integrated circuit high in chip area utilization, without causing excess and deficiency of the interconnecting resources.

To achieve the above-mentioned object, the present invention provides a field programmable gate array, comprising: a first wire group composed of a plurality of first wires; a second wire group composed of a plurality of second wires; switching means provided at least one intersection between the first and second wires of said first and second wire groups, for determining connection and disconnection between both when programmed; and a basic cell having a first transmission gate turned on in response to a high gate voltage and a second transmission gate turned on in response to a low gate voltage, gates of the first and second transmission gates being connected to each other as a common gate or being connectable to each other as a common gate by said switching means when programmed, input and output terminals and the common gates of the first and second transmission gates being connected to any of the first wires of said first wire group, respectively.

Further, the present invention provides a field programmable gate array, comprising: a basic cell having a first transmission gate turned on in response to a high gate voltage and a second transmission gate turned on in response to a low gate voltage, gates of the first and second transmission gates being connected to each other as a common gate or being connectable to each other as a common gate by switching means when programmed; first voltage supplying means for selectively supplying any one of high and low voltages to one of the input and the output terminals of each of the first and second transmission gates of said basic cell, respectively; determining means for selectively determining turn-on or -off status of each of the first and second transmission gates by compulsorily controlling gate voltages of the first and second transmission gates, respectively; and second voltage supplying means for selectively supplying any one of high and low voltages to the other of the input and output terminals of each of the first and second transmission gates of said basic cell, respectively; and discriminating means for discriminating whether voltage at the other of the input and output terminals of each of the first and second transmission gates is high or low, respectively.

Further, the present invention provides a semiconductor integrated circuit, comprising: a plurality of circuit elements; a plurality of first wires connected to said circuit elements, respectively; a plurality of second wires for connecting said first wires, respectively; and a plurality of switching means interposed between said first and second wires respectively, for selectively connecting said first and second wires when programmed, the number of said second wires being represented by a monotonic decreasing function with respect to length of said second wires, and dependency of the number of said second wires upon the length thereof lying within a range between −2 power and −3 power of the length thereof.

In the field programmable gate array according to the present invention, since a pair of transmission gates conductive in response to high and low voltages are used, the programmability is high as compared with the cells of unit transistors. In addition, since the number of the programmable elements is small, a delay caused by the parasitic resistances and capacitance is small. Further, it is possible to increase the average utilization efficiency of the cells, as compared with the cells arranged around the multiplexer.

When the transmission gates are at least so designed as to be switchable from the turn-on status to the turn-off status or vice versa, respectively before programmed by the programmable elements, the device can be tested before shipping as follows: Under the respective on- or off-statuses, a high/low potential is applied to one of the input and output terminals of the transmission gates, and the potentials at the other of the input and output terminals thereof are checked as to whether being high or low. On the basis of the checked results, it is possible to discriminate whether the transmission gates are non-defective or defective.

Further, in the integrated circuit whose interconnection can be designed by the user according to the present invention, the interconnecting resources are sufficient and thereby the chip area can be utilized efficiently

BRIEF DESCRIPTION OF THE DRAWINGS

FIGS. 4(a) and 4(b) are illustrations for assistance in explaining the characteristics of the programmable elements;

FIGS. 5(a) and 5(b) are a diagram showing an inverter configuration and a truth table thereof in the first embodiment shown in FIG. 1;

FIGS. 6(a) and 6(b) are a diagram showing a buffer configuration and a truth table thereof in the first embodiment shown in FIG. 1;

FIGS. 7(a) and 7(b) are a diagram showing a two-input NAND configuration and a truth table thereof in the first embodiment shown in FIG. 1;

FIGS. 8(a) and 8(b) are a diagram showing a two-input AND configuration and a truth table thereof in the first embodiment shown in FIG. 1;

FIGS. 9(a) and 9(b) are a diagram showing a tri-state inverter configuration and a truth table thereof in the first embodiment shown in FIG. 1;

FIGS. 10(a) and 10(b) are a diagram showing a tri-state buffer configuration and a truth table thereof in the first embodiment shown in FIG. 1;

FIGS. 11(a) to 11(c) are a diagram showing a two-input exclusive OR configuration, a truth table thereof and an equivalent circuit thereof in the first embodiment shown in FIG. 1;

FIGS. 12(a) to 12(c) a diagram showing a D flip-flop configuration, a truth table thereof and an equivalent circuit thereof in the first embodiment shown in FIG. 1;

FIG. 13 is a circuit diagram showing a second embodiment of the circuit device according to the present invention;

FIGS. 14(a) to (C) are diagrams showing a logical circuit configuration, a truth table thereof and an equivalent circuit thereof in the second embodiment of the circuit device according to the present invention;

FIGS. 18(a) to 18(c) are a diagram showing a two-input NAND configuration, a truth table thereof and an equivalent circuit thereof in the fifth embodiment of the circuit device according to the present invention;

DETAILED DESCRIPTION OF THE PREFERRED EMBODIMENTS

Figure 2:
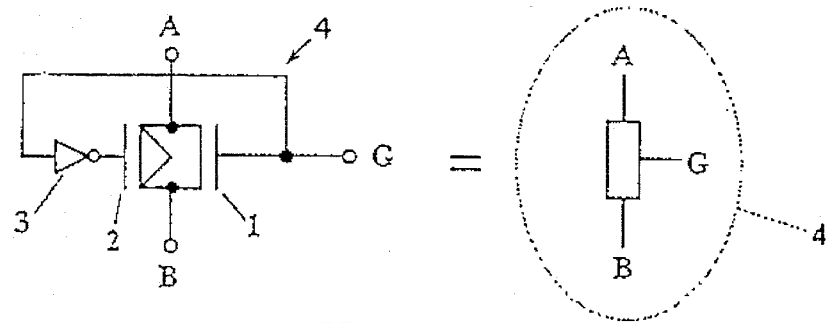
FIG. 2 is a circuit diagram and a symbol of a first type transmission gate.
Figure 3:
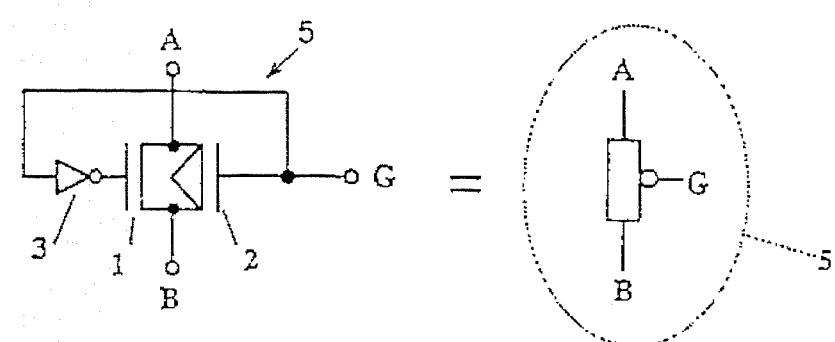
FIG. 3 is a circuit diagram and a symbol of a second type transmission gate.
Figure 15:
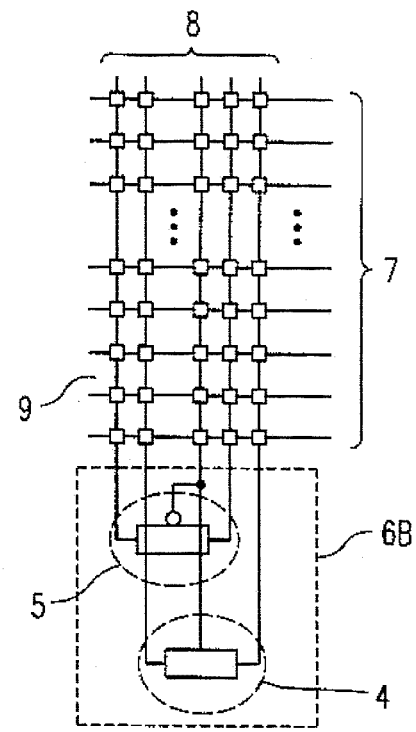
FIG. 15 is a circuit diagram showing a third embodiment of the circuit device according to the present invention.

The embodiments of the present invention will be described hereinbelow with reference to the attached drawings. In the first embodiment, a plurality of basic cells (one is shown in FIG. 15) are arranged in an array pattern. The basic cell is composed of a first transmission gate 4 which can be turned on when a high gate voltage is applied to the gate (as shown in FIG. 2) and a second transmission gate 5 which can be turned on when a low gate voltage is applied to the gate (as shown in FIG. 3), and the two gates of these transmission gates are connected or connectably arranged through programmable elements. In this structure, it is possible to obtain an FPGA (field programmable gate array) high in cell utilization efficiency and operating speed, and easy to realize the GA library.

Prior to the description of the embodiment, the first and second transmission gates will first be described.

FIG. 2 shows the first type transmission gate 4, in which the sources and drains of an n-type FET 1 and a p-type FET 2 are connected to each other in common. One of the terminals is referred to as a terminal A and the other of the terminals is referred to as a terminal B, respectively. Further, these terminals A and B are referred to as input or output terminals sometimes. As shown in FIG. 2, the gate of the FET 1 is directly connected to a terminal G and the gate of the FET 2 is connected to the terminal G via an inverter 3. When a supply potential is applied to the terminal G, the FETs 1 and 2 are both turned on, so that the terminals A and B are shorted to each other. On the other hand, when a ground potential is applied to the terminal G, the FETs 1 and 2 are both turned off, so that the terminals A and B are disconnected to each other.

FIG. 3 shows the second type transmission gate 5, which is turned on when the voltage applied to the terminal G is low.

The gate 5 shown in FIG. 3 is different from the gate 4 shown in FIG. 2 in that the gate of the n-type FET 1 is connected to the terminal G via an inverter and the gate of the p-type FET 2 is directly connected to the terminal G. When a ground potential is applied to the terminal G, the FETs 1 and 2 are both turned on, so that the terminals A and B are shorted to each other. On the other hand, when a supply potential is applied to the terminal G, the FETs 1 and 2 are both turned off, so that the terminals A and B are disconnected to each other.

In FIGS. 4 and after, the first and second transmission gates 4 and 5 will be shown by use of the symbols as shown on the right side in FIGS. 2 and 3.

Figure 1:
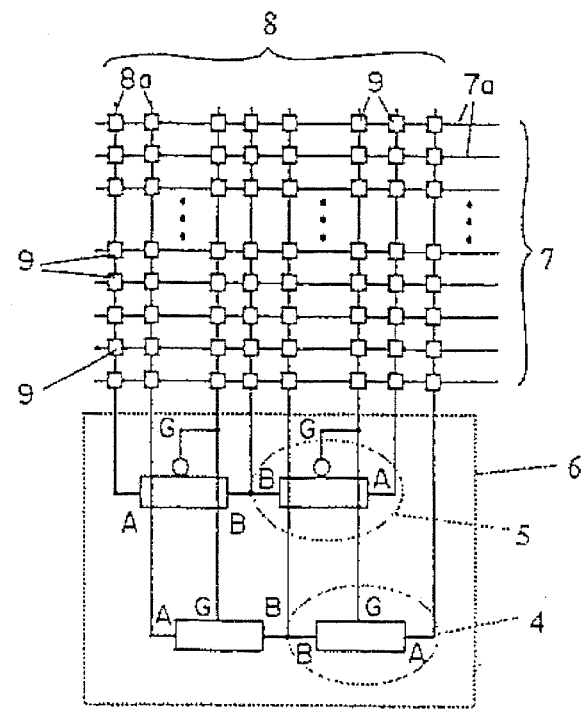
FIG. 1 is a circuit diagram showing a first embodiment of the circuit device according to the present invention.

FIG. 1 shows a first embodiment of the present invention, in which two pairs of the first and second transmission gates 4 and 5 connected as shown in FIG. 1 are used as a basic block 6. A wire group 8 extending from the respective junction points of the basic block 6 intersects a wire group 7 composed of supply voltage wires, ground wires, clock wires, and signal wires, etc. Programmable elements 9 are arranged at the respective intersectional points between the two wire groups 8 and 7. The programmable elements 9 are elements whose impedance can be changed largely before and after the programming. That is, the impedance thereof can be increased or decreased after the programming. In this specification, the elements whose impedance is decreased after the programming will be explained. In more detail, FIG. 4(a) shows the status in which the element 9 is not yet programmed; and FIG. 4(b) shows the status in which the element 9 has been programmed. In the case of the non-programmed element 9 (NP) as shown in FIG. 4(a), the resistance R between the wires 7 and 8 is sufficiently large. In the case of the programmed element 9 (P) as shown in FIG. 4(b), the resistance R between the wires 7 and 8 is sufficiently small. In other words, it is possible to connect/disconnect the wires 7a and 8a by properly using the programmed and non-programmed elements 9. In this specification, the non-programmed elements (NP) 9 are represented by the symbol as shown in FIG. 4(a) above, and the programmed elements (P) 9 are represented by the symbol as shown in FIG. 4(b) above, respectively.

In the circuit device as shown in FIG. 1, it is possible to construct various logic circuits by selectively programming the programmable elements 9. FIGS. 5 to 12 show several examples.

FIG. 5(a) shows a device so programmed as to satisfy the input/output relationship as listed in a truth table as shown in FIG. 5(b). The circuit shown in FIG. 5(a) is an inverter, in which the wire 7-1 is connected to a supply potential VDD and the wire 7-2 is connected to a ground potential GND. The supply potential VDD and the ground potential GND are sometimes substituted for "1" and "0" in this specification and the truth table. The wires 7-7 and 7-8 are connected to an input A and an output Z of the inverter, respectively via the programmable elements $9_{76}$, $9_{87}$ and $9_{88}$ programmed. That is, the input A is connected to the gates of the transmission gates 4-2 and 5-2, and the output Z is connected to one of the input/output terminals of each of these transmission gates 4-2 and 5-2. Further, the ground line and the supply voltage line are connected to the other of the input/output terminals of each of these transmission gates 4-2 and 5-2 via the programmable elements $9_{25}$ and $9_{14}$, respectively.

Figure 27:
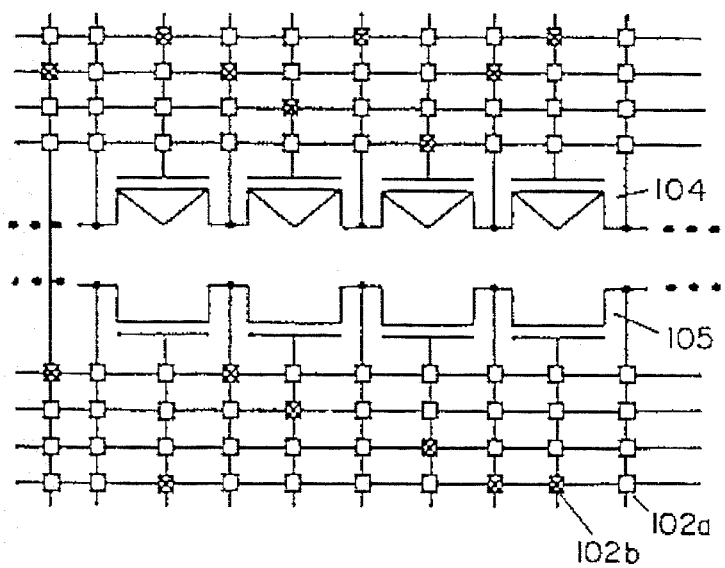
FIG. 27 is a circuit diagram showing the conventional FPGA using unit transistors.

FIGS. 6(a) and (b) show a buffer and the truth table thereof, which are basically the same as those shown in FIGS. 5(a) and (b). The buffer shown in FIG. 6(a) is different from the inverter shown in FIG. 5(a) in that the programmable elements $9_{14}$ and $9_{25}$ are programmed in FIG. 5(a) but the programmable elements $9_{15}$ and $9_{24}$ are programmed in FIG. 6(a). In general, when the cells composed of the unit transistors as shown in FIG. 27 are used, the numbers of the cells and the programmable elements required to construct the buffer are twice larger than those required for the inverter. In this embodiment, however, there exists no difference between the two (buffer and inverter) in the numbers of the basic blocks and the programmable elements to be programmed. This advantage can be applied to other cases. Further, since the size of the basic block is determined on the basis of the size of the transistor to be programmed, the size of the basic block is substantially the same as the size of the unit transistor. Therefore, in this embodiment, it is possible to conclude that the cells of the present invention is high in the programmability per unit area. In addition, since the circuit configuration can be simplified as compared with the cells having a multi-input multiplexer as the basic cell, the operating speed is high.

FIGS. 7(a) and (b) show a two-input NAND and the truth table thereof, in which the wires 7-6 and 7-7 are connected to the inputs A and B, and the wire 7-8 is connected to the output Z, respectively. In FIG. 6(a), only two (4-2 and 5-2) of the four transmission gates are used. In FIG. 7(a), however, all the four transmission gates 4-1, 4-2, 5-1 and 5-2 are used by programming the four programmable elements $9_{63}, 9_{84}, 9_{76},$ and $9_{88}$.

FIGS. 8(a) and (b) show a two-input AND and the truth table thereof, in which the four transmission gates are used in the same way as in FIG. 7(a). However, the programmable elements to be programmed are different from those shown in FIG. 7(a). That is, in FIG. 8(a), the seven programmable elements $9_{18}, 9_{21}, 9_{27}, 9_{66}, 9_{73}, 9_{82}$ and $9_{84}$ are programmed.

FIGS. 9(a) and (b) show a tri-state inverter and the truth table thereof, in which the wire 7-6 is connected to the input A; the wire 7-3 is connected to the input E; and the wire 7-7 is connected to the output Z, respectively. When the enable input E is at "0", the output Z is at an high impedance (shown HZ in FIG. 9(b)); and when the enable input E is at "1", the circuit functions as a buffer. In FIG. 9(a), the seven programmable elements $9_{17}, 9_{28}, 9_{33}, 9_{66}, 9_{72}, 9_{84}$ and $9_{85}$ are programmed.

FIGS. 10(a) and (b) show a tri-state buffer and the truth table thereof. In the same way as in FIG. 10(a), when the enable input E is at "0", the output Z is at an high impedance (shown HZ in FIG. 10(b)); and when the enable input E is at "1", the circuit functions as a buffer. In FIG. 10(a), the seven programmable elements $9_{18}, 9_{27}, 9_{33}, 9_{66}, 9_{72}, 9_{84}$ and $9_{85}$ are programmed. This circuit is different from that shown in FIG. 9(a) in that the programmable elements $9_{18}$ and $9_{27}$ are programmed, instead of the programmable elements $9_{17}$ and $9_{28}$.

FIGS. 11(a), (b) and (c) show a two-input EX-OR (exclusive OR), the truth table thereof and an equivalent circuit thereof, respectively. In FIG. 11(a), the wires 7-7 and 7-8 are connected to the inputs A and B, respectively; and the wire 7-5 is connected to the output Z. FIG. 11(c) shows a circuit obtained by programming the programmable elements as shown in FIG. 11(a). In FIGS. 11(a) and (c), the same transmission gates are denoted by the same reference numerals. Further, in FIG. 11(a), the transmission gates 5-4 and 4-4 are both not used in this example.

FIGS. 12(a), (b) and (c) show a D flip-flop, the truth table thereof and an equivalent circuit thereof. In FIG. 12(a). The wires 7-3, 7-7 and 7-8 are connected to a clock inputs CLK, an output Q and an input D, respectively. FIG. 12(c) shows a circuit obtained by programming the programmable elements as shown in FIG. 12(a). In FIGS. 12(a) and (c), the same transmission gates are denoted by the same reference numerals. Further, in FIG. 12(a), the transmission gates 5-4, 4-1, 5-6 and 4-6 are all not used in this example. The other flip,flops can be realized in the similar configuration.

FIG. 13 shows a second embodiment, in which a different basic block 6A is used. Being different from the basic block 6 shown in FIG. 1, in this basic block 6A, the input and output terminals of the two first transmission gates 4-1 and 4-2 are not connected to each other. In other words, the wires 8-1 and 8-2 are connected to the drains of the first transmission gates 4-1 and 4-2, separately. Although the operating speed is slightly reduced when some circuits are configured, since the programmability can be improved, the unitization efficiency of the cells can be further improved.

FIGS. 14(a) shows an example of a logic circuit configured by programming the programmable elements shown in FIG. 13; 14(b) shows the truth table thereof; and FIG. 14(c) shows an equivalent circuit denoted by the MIL symbols. FIG. 14(a) indicates that when the basic block as shown in FIG. 13 is used, the logic circuit which requires two basic blocks 6 (shown in FIG. 1) can be configured by use of only a single basic block 6A. In FIG. 14(a), the wires 7-6 and 7-7 are connected to the two inputs A and B; and the wire 7-8 is connected to the output Z. In this example, in the transmission gates included in the two cells for constituting the basic block, the input and output terminals of the first transmission gate are not connected, but the input and output terminals of the second transmission gate are connected to each other. In contrast with this, it is also possible to consider another embodiment in which the input and output terminals of the first transmission gates are connected to each other and the input and output terminals of the second transmission gate are not connected to each other. The embodiment will be described later.

FIG. 15 shows a third embodiment, in which another basic cell 6B is used. In FIG. 15, the basic cell 6B is composed of only single first and second transmission gates 4 and 5. Although the operating speed is slightly lowered when some circuits are configured, since the programmability can be improved, the unitization efficiency of the cells can be also improved.

Figure 16:
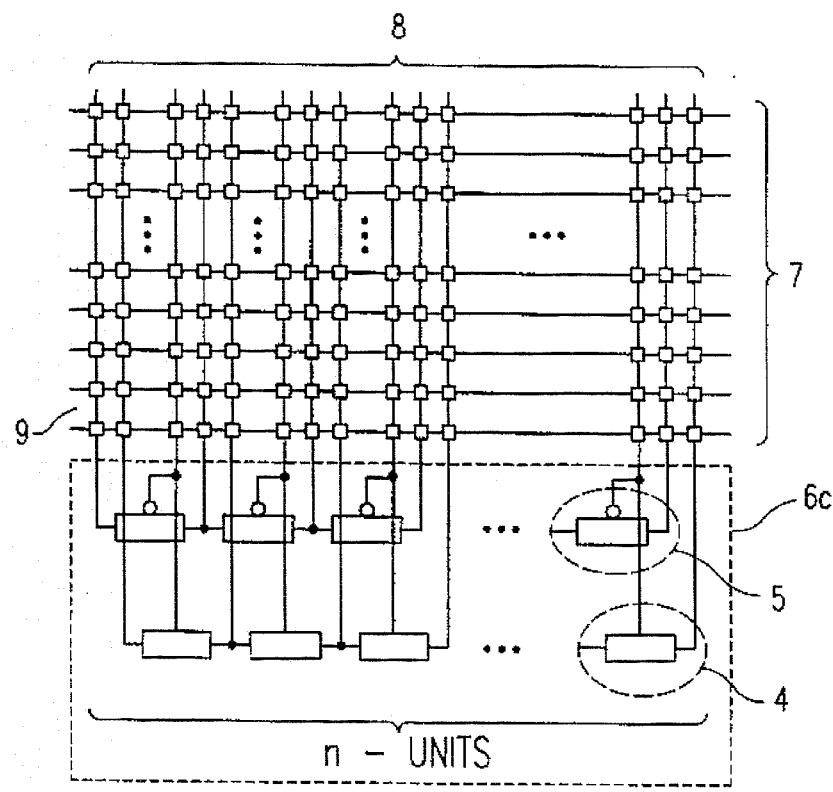
FIG. 16 is a circuit diagram showing a fourth embodiment of the circuit device according to the present invention.

FIG. 16 shows a fourth embodiment, in which another basic block 6C is used. In FIG. 16, n-units of first and second transmission gates are connected in series. In other words, n-pairs of the first and second transmission gates are used. In this embodiment, if n is 1, this embodiment corresponds to the circuit shown in FIG. 15; and if n is 2, this embodiment corresponds to the circuit shown in FIG. 1. Therefore, by changing the number n of pairs, it is possible to adjust the trade-off (the balance) between the operating speed and the programmability.

Figure 17:
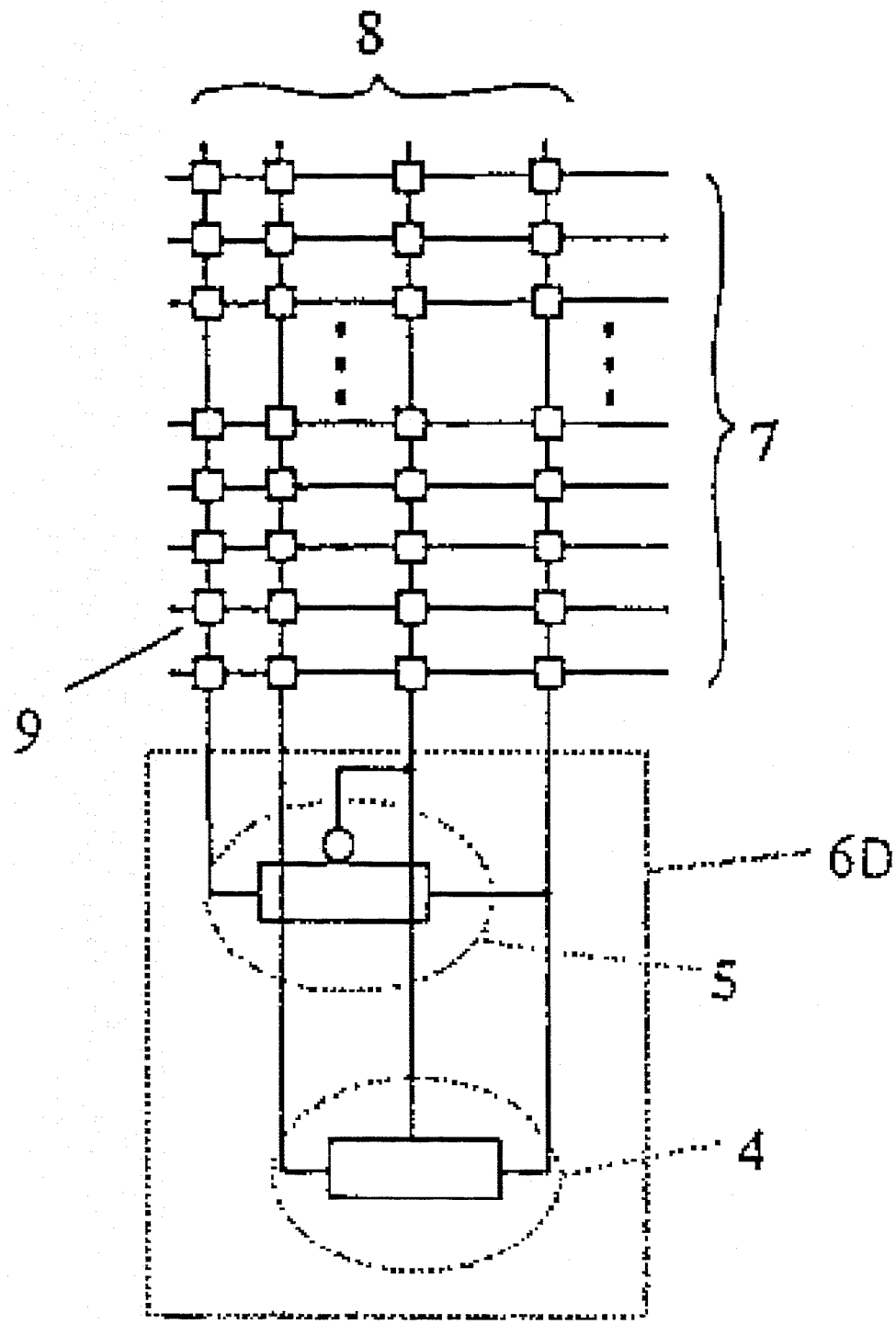
FIG. 17 is a circuit diagram showing a fifth embodiment of the circuit device according to the present invention.
Figure 19:
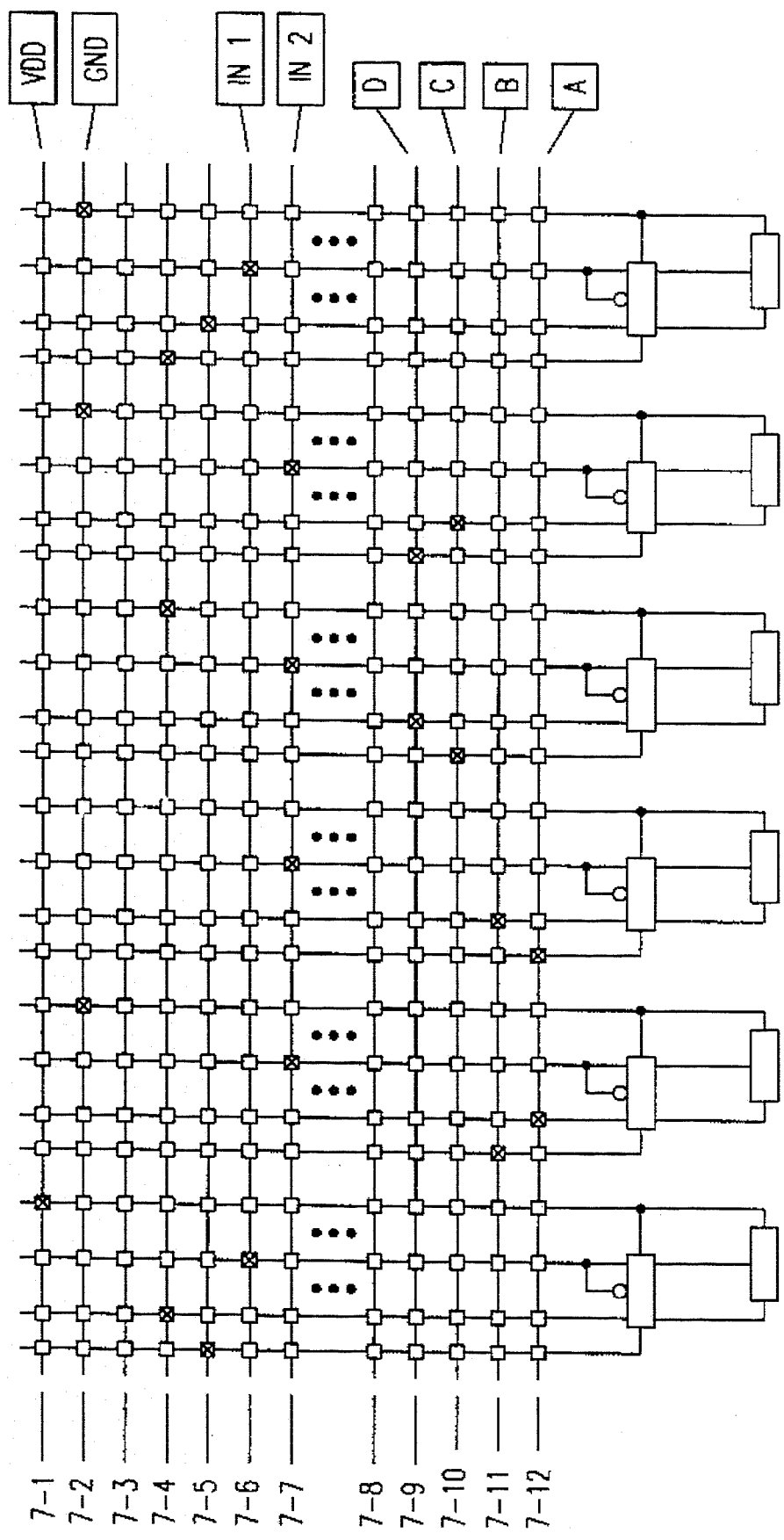
FIGS. 19(a) to 19(c) are a diagram showing a two-input decoder configuration, a truth table thereof and an equivalent circuit thereof in the fifth embodiment of the circuit device according to the present invention.
Figure 19:
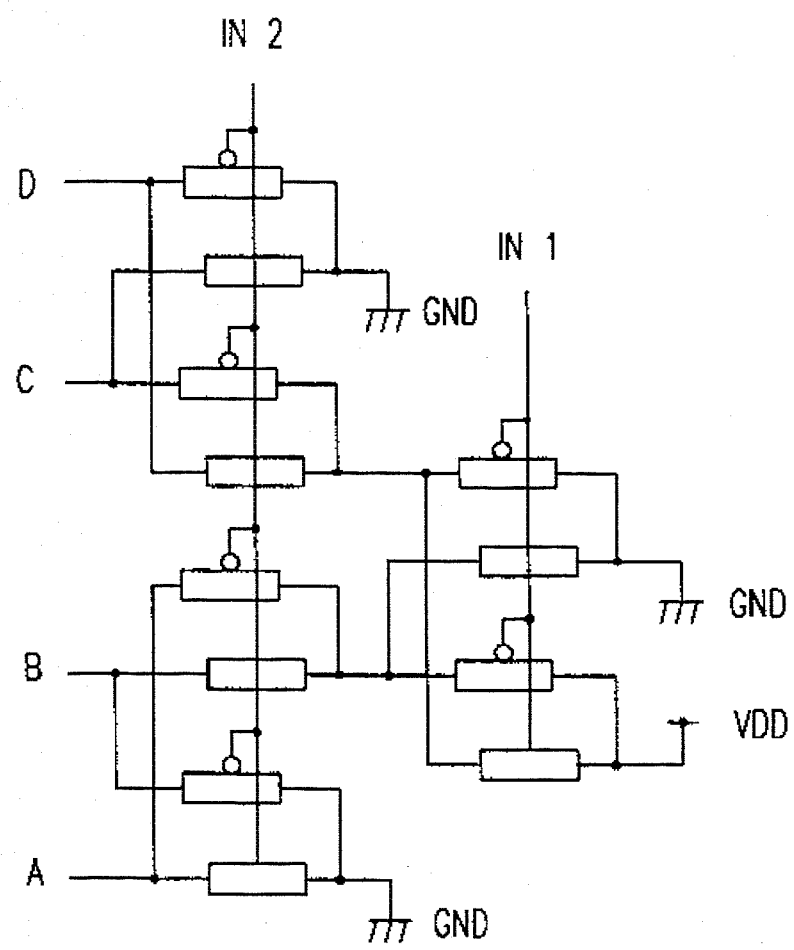
Figure 20A:
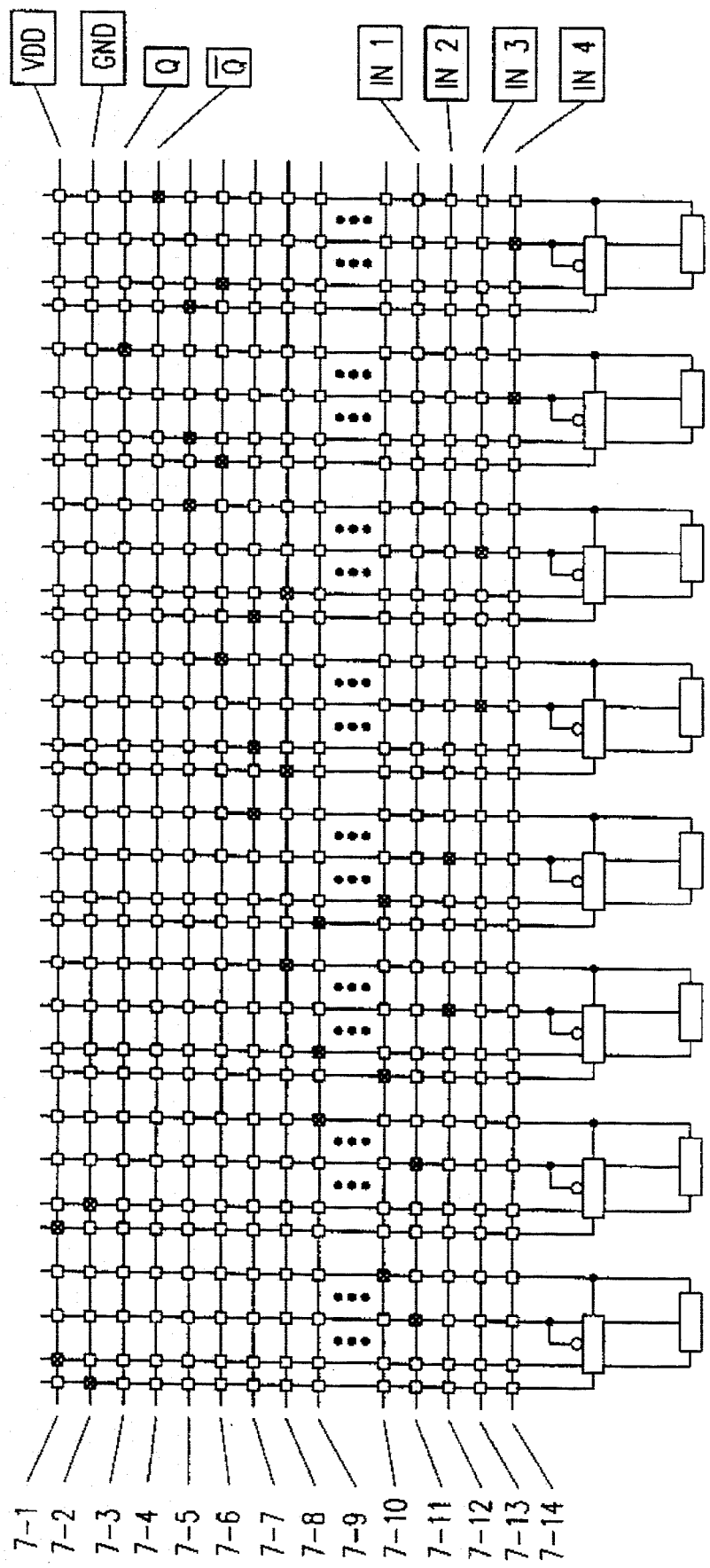
FIGS. 20(a) to (c) are a diagram showing a parity generator configuration, a truth table thereof and an equivalent circuit thereof in the fifth embodiment of the circuit device according to the present invention.
Figure 20:
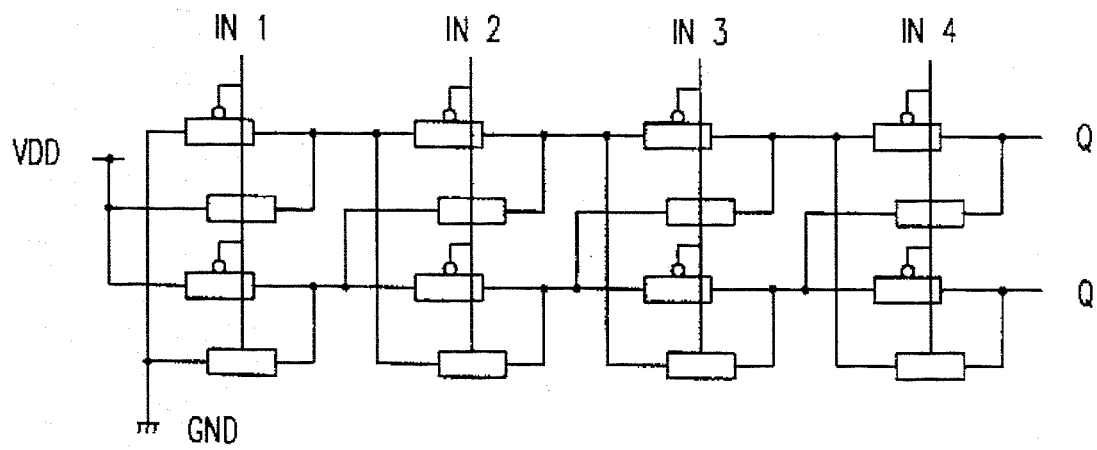
Figure 28:
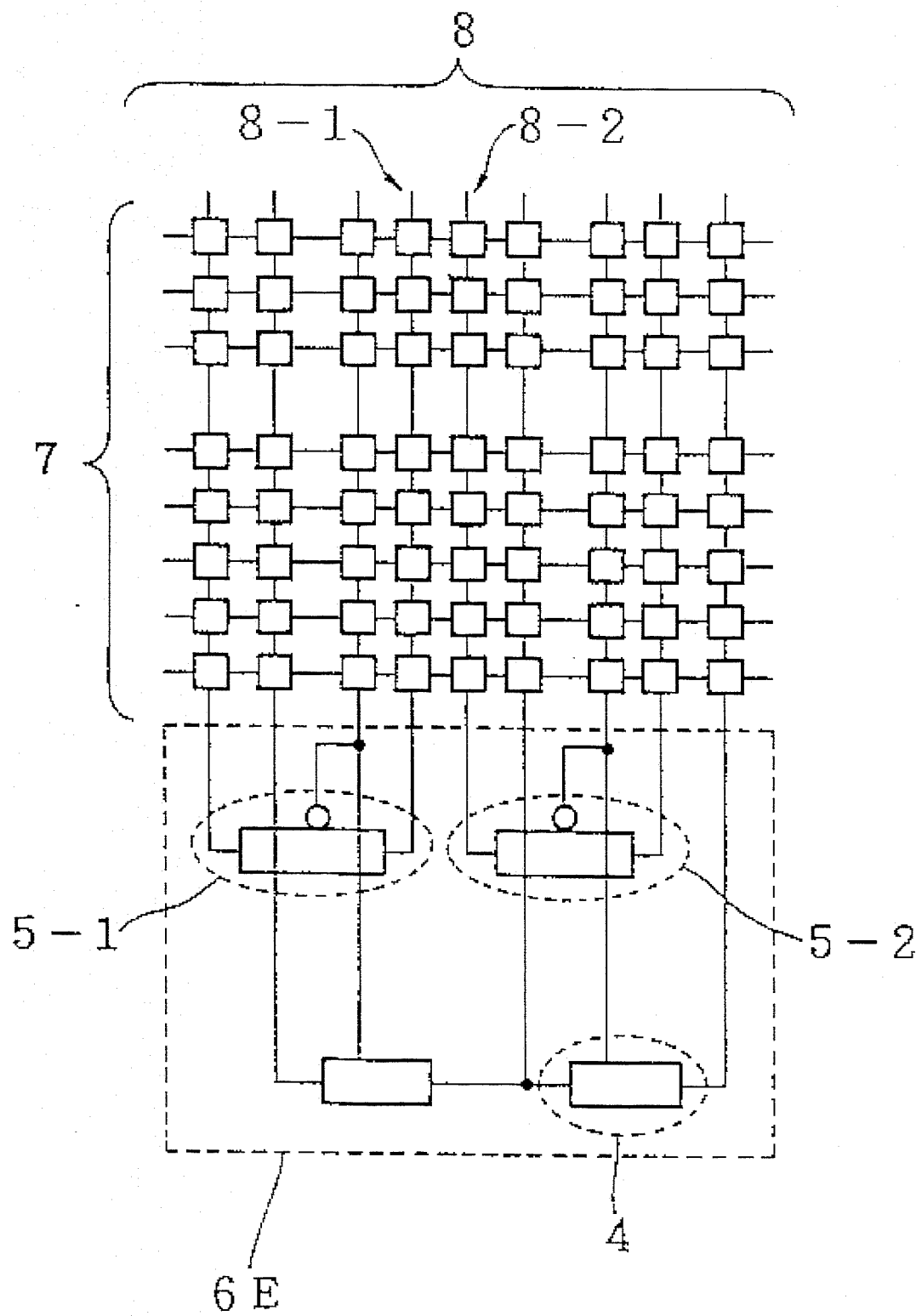
FIG. 28 is a circuit diagram showing a sixth embodiment of the present invention.
Figure 29:
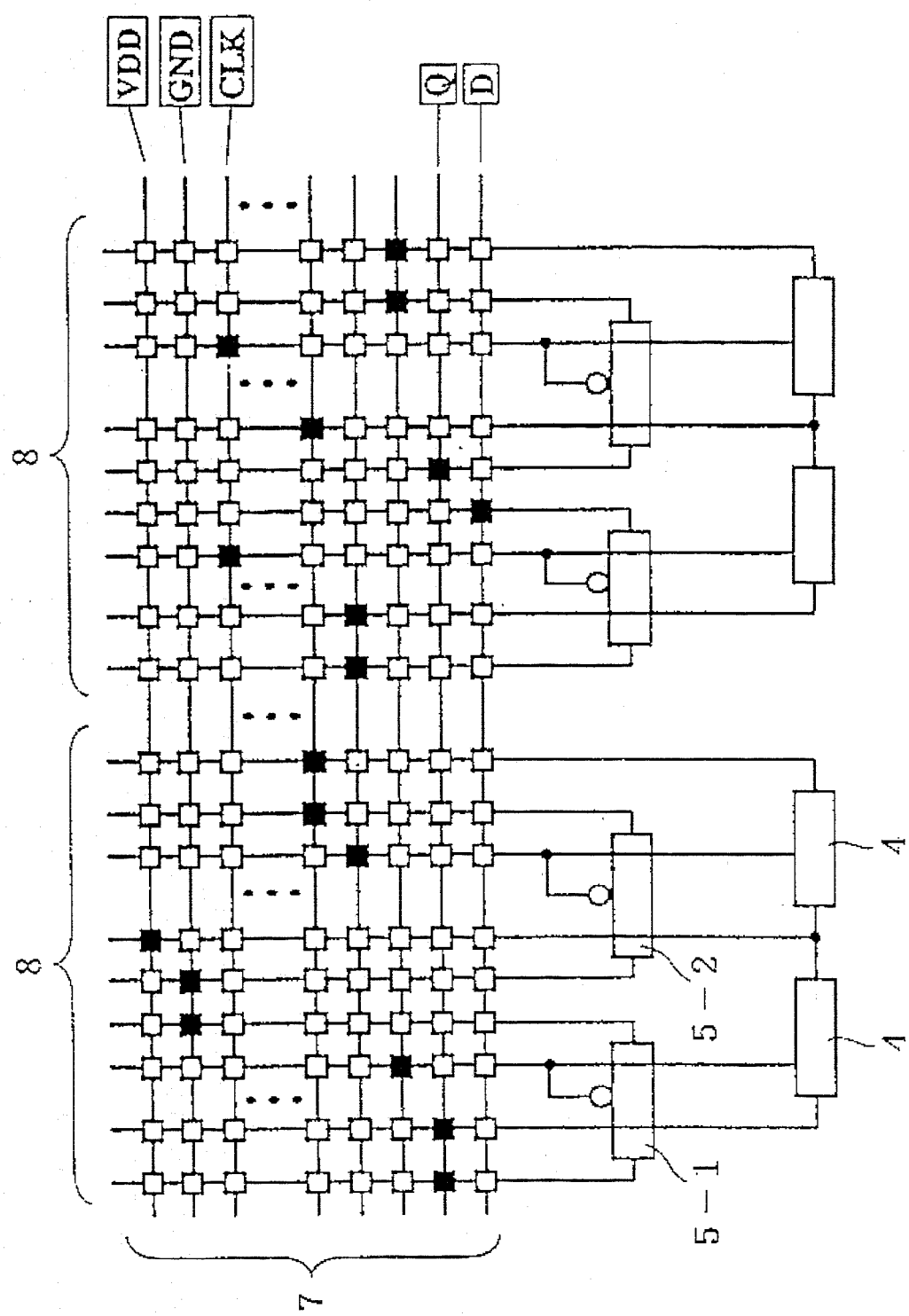
FIG. 29 is a flip-flop circuit composed of the sixth embodiment.

FIG. 17 shows a fifth embodiment, in which another basic block 6D is used. In FIG. 17, one of the input and output terminals of the first transmission gate 4 and one of the input and output terminals of the second transmission gate 5 both constituting the basic cell are connected to each other. In this embodiment, it is possible to reduce the number of programmable elements. In the case of this basic block, some logic circuits can be realized by the connections slightly different from the above-mentioned first to fourth embodiments. FIGS. 18(a) to (c) show a two-input NAND circuit, the truth table thereof, and an equivalent circuit thereof, respectively. This two-input NAND circuit is different in connection from that of the first embodiment as shown in FIG. 7. Further, when this basic block is used, there exists the case where it is possible to configure a decoder or a parity generator efficiently. FIGS. 19(a) to (c) show a two-input decoder circuit, the truth table thereof, and an equivalent circuit thereof, respectively. FIGS. 20(a) to (c) show a 4-bit parity generator, the truth table thereof, and an equivalent circuit thereof, respectively. FIG. 28 is a sixth embodiment which uses a basic block 6E, in which the output terminals of two second transmission gates 5-1 and 5-2 are not connected to each other. In other words, wires 8-1 and 8-2 are connected to drains of other second transmission gates 5-1 and 5-2, respectively. Accordingly, it is possible to construct certain circuits more effectively. For instance, FIG. 29 shows a flip-flop circuit as shown in FIGS. 12(b) and (c), which uses two basic blocks as shown in FIG. 28. In the case of the basic block 6 of the first embodiment, three blocks as shown in FIG. 12(a) are required. In this embodiment, however, when the basic block 6E is adopted, it is possible to construct the flip-flop circuit by use of two blocks. Further, in FIG. 29 and other drawings, the programmable elements shown in black indicate that the elements have been already programmed as shown in FIG. 4(b).

In the above-mentioned embodiments, the programmable elements are used in such a way that the resistance of the programmable element can be reduced when programmed. Without being limited thereto, however, it is of course possible to use the programmable elements whose resistance can be reduced when not programmed but increased when programmed.

Further, in the above-mentioned embodiments, the programmable elements are arranged at all the intersectional points between the two wire groups (one wire group extends from the cell). However, it is possible to omit some of the programmable elements in accordance with a predetermined rule.

Figure 21:
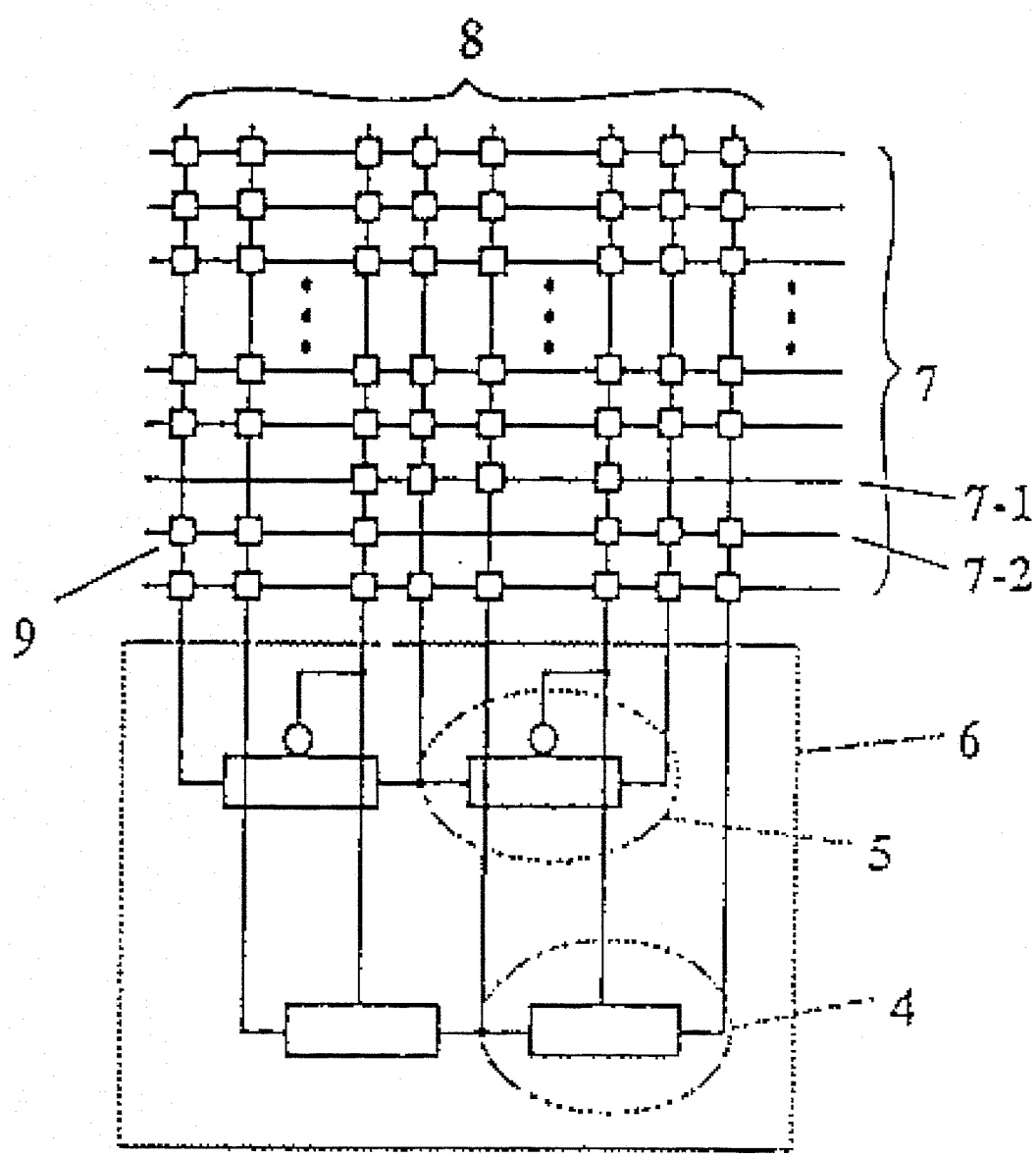
FIG. 21 is a diagram showing an example of reduction in the number of the programmable elements.

FIG. 21 shows an example, in which some programmable elements are omitted in the first embodiment. In FIG. 21, in the case of the wire 7-1, the programmable elements are arranged only at the intersectional points between the wire 7-1 and the wires extending from the gates and the middles of the input and output terminals of the cell. Further, in the case of the wire 7-2, the programmable elements are arranged only at the intersectional points between the wire 7-2 and the wires extending from the gates and the both ends of the input and output terminals of the cell.

Further, the programmable elements are arranged between the gate terminals of the first and second transmission gates. When these elements are programmed, the gates can be used as the common gates.

Figures 30A, 30B:
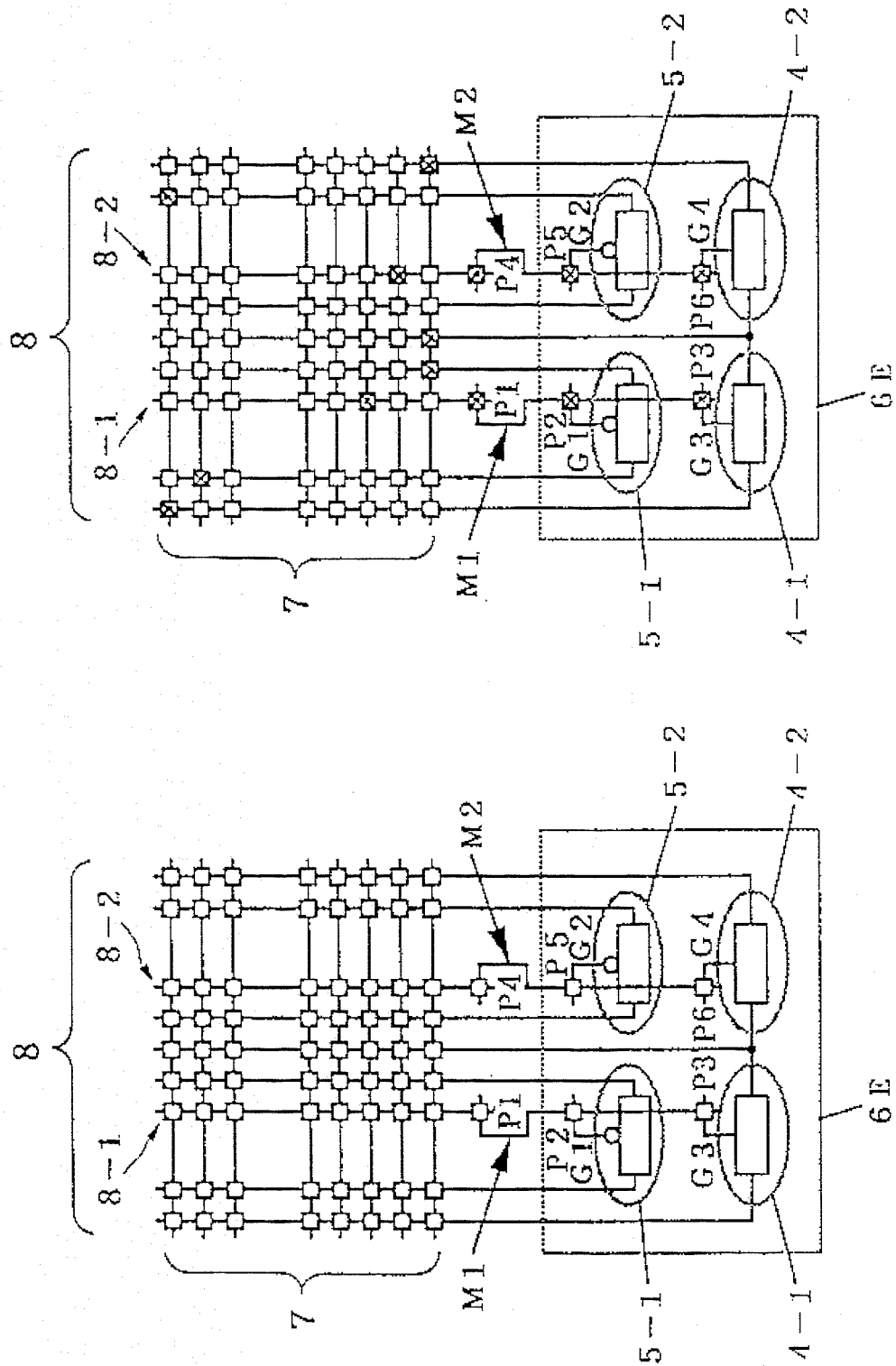
FIGS. 30(a) and 30(b) examples in which the gate terminals of the first and second transmission gates are connected in common by programming the programmable elements connected between the gate terminals of the two transmission gates.

The above-mentioned description is explained in more detail with reference to FIG. 30, in which the basic block 6E is used. As shown in FIG. 30(a), the gate terminals (G1 and G3) of the transmission gates 5-1 and 4-1 and the gate terminals (G2 and G4) of the transmission gates 5-2 and 4-2 are not connected to each other, respectively at the initial conditions. However, in order to connect the gates of the transmission gates, there are provided programmable elements P1 to P6 (which are high impedance before programmed and become low impedance after programmed) and intermediate wires M1 and M2. Under the conditions that the programmable elements P1 to P6 are not yet programmed, it is possible to apply independent potentials to the gate terminals G1 to G4 and the wires 8-1 and 8-2, respectively. After the horizontal wire resources and the wires 8 have been programmed, when elements P1 to P6 are programmed as shown in FIG. 30(b), it is possible to connect the gate terminals G3 and G1 of the transmission gates 4-1 and 5-1 to the wire 8-1 via the intermediate wire M1, and also it is possible to connect the gate terminals G4 and G2 of the transmission gates 4-2 and 5-2 to the wire 8-2 via the intermediate wire M2, respectively. In this method, it is possible to control the turn-on/off of the respective transmission gates independently, without programming the programmable elements to certain programming stages.

Figure 31A:
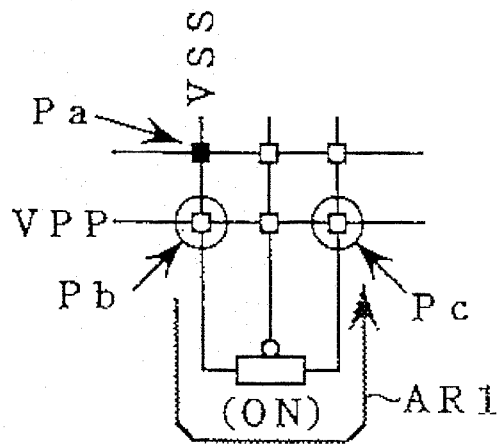
FIGS. 31(a), 31(b), 31(c) and 31(d) are views for assistance in explaining the method of preventing erroneous write to the programmable elements.
Figure 31B:
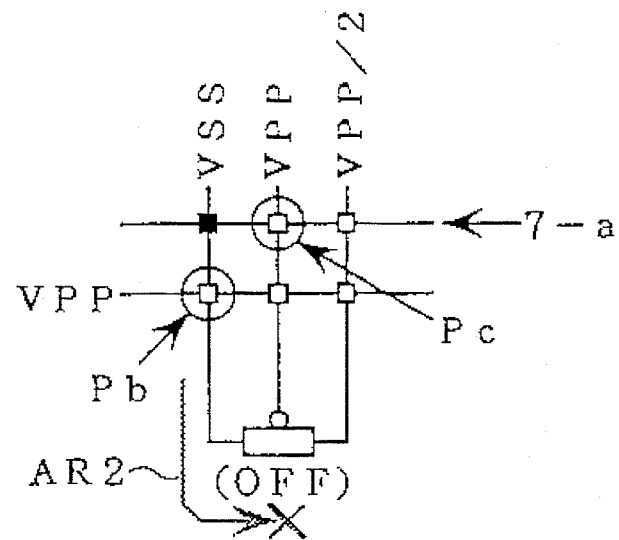
Figure 31C:
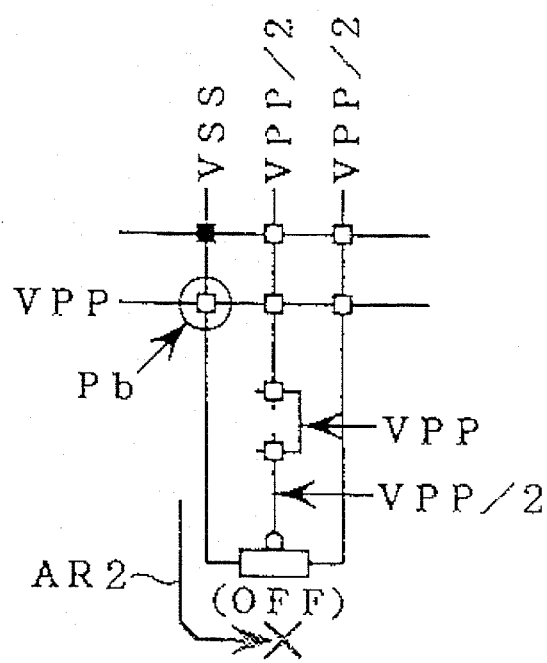
Figure 31D:
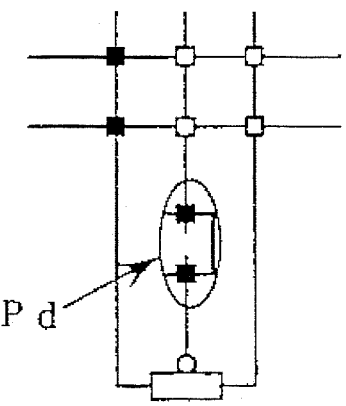

Here, with reference to FIG. 31, the prevention of erroneous writing of the programmable elements will be described. FIG. 31(a) shows an erroneous writing mode due to voltage detour; FIG. 31(b) shows an erroneous writing mode of when the transmission gate is turned off; FIG. 31(c) shows an erroneous writing mode prevention method of when the transmission gate is turned off; and FIG. 31(d) shows the final state of the programming. In these drawings, Pa denotes the elements already programmed; Pb denotes the elements required to be programmed; Pc denotes the elements having a possibility of being programmed; and Pd denotes the elements to be programmed at the end. In the above-mentioned drawings, the arrow AR1 denotes the voltage detour; and the arrow AR2 denotes the suppression of the voltage detour. Further, in FIG. 31(b), the wire 7-a denotes the wire whose voltage is set to Vss by the already programmed elements.

The method of controlling the turn-on/off of the respective transmission gates independently (without programming the programmable elements to certain programming stages) is effective to prevent the detour of the programming voltage through the transmission gate as shown in FIG. 31(a) (which occurs when programmed). In order to prevent the voltage detour, VSS must be applied to the gate of the first transmission gate now being programmed, and VPP must be applied to the gate of the second transmission gate. In this case, however, when these voltages are simply applied to the gate terminal, there exists a possibility that the programmable element between the gate itself and the interconnecting resource is written erroneously as shown in FIG. 31(b). Therefore, as shown in FIG. 31(c), the gate wire is divided into three parts by the programmable elements. Further, a potential VPP for turning off the transmission gate is applied to the divided part nearest to the transmission gate; an intermediate potential VPP/2 is applied to the intermediate part; and the divided part farthest from the transmission gate is allowed to be programmed freely. In this structure, it is possible to prevent the erroneous writing due to the detour of the programming voltage.

Further, various modifications may be made within the scope without departing the gist of the present invention.

Here, the circuit configuration for facilitating the function test of the basic blocks for the above-mentioned FPGA will be described hereinbelow. This function test is necessary to remove the defective products before shipping.

Figure 32:
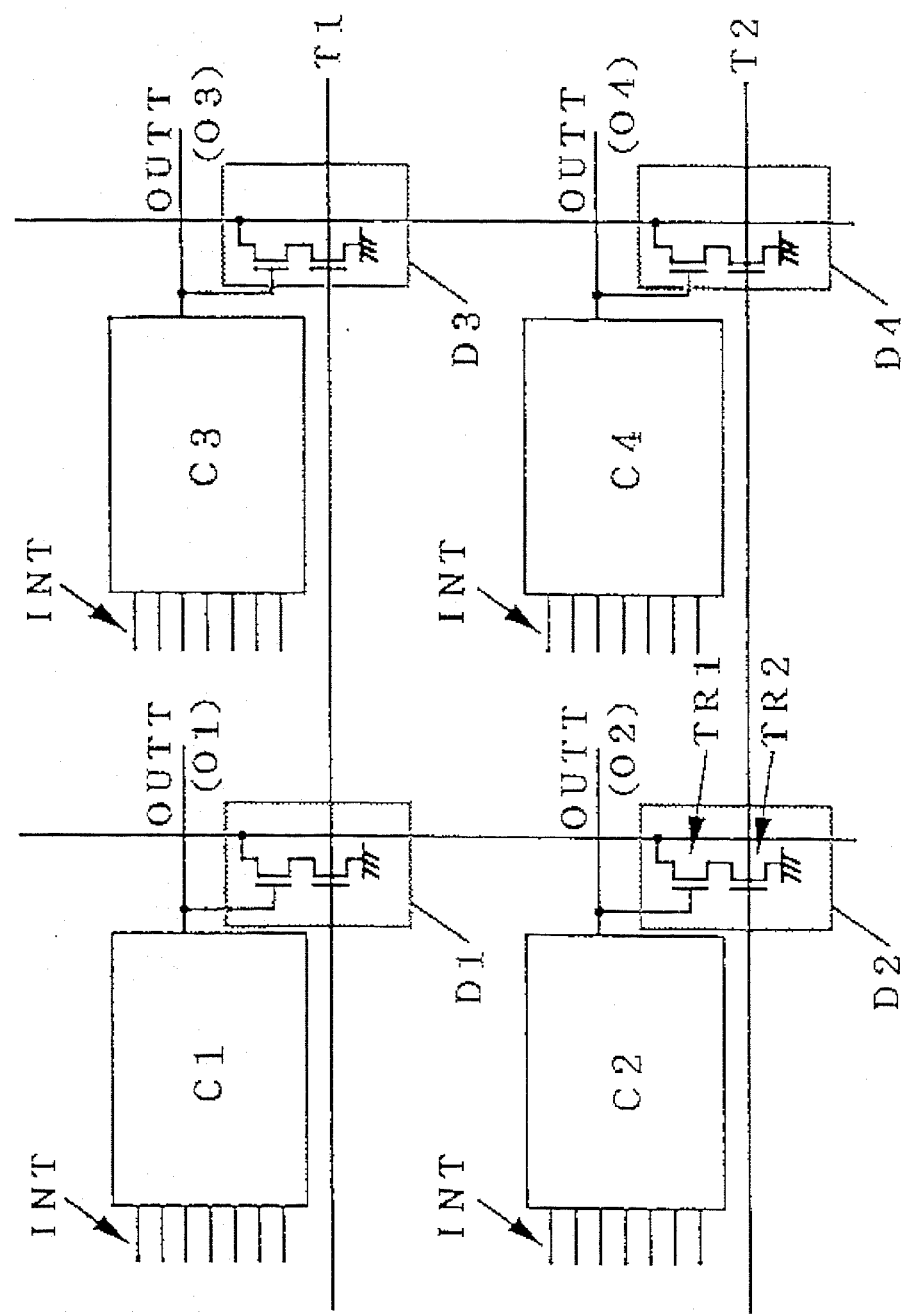
FIG. 32 is an example of the prior art test circuit.

Here, FIG. 32 shows an example of the prior art test circuit, in which D1 to D4 denote the detectors; INT denotes the input terminals; C1 to C4 denote the basic cells; and O1, O2, O3 and O4 denote the output terminals, respectively. The operation of when the basic cell C2 is tested by this prior art circuit will be described hereinbelow. First, only the control wire T2 of the two control wires T1 and T2 extending horizontally through the detector D1 to D4, respectively is set to a high-level(H-level); the transistors TR2 of the detectors D2 and D4 are turned on; and the output line R1 of the detectors D1 and D2 is set to a precharged state of $V_{DD}$. Under these conditions, when a test signal is applied to the input of the cell C2, if the output O2 is at the H-level, since the transistor TR1 is turned on, the output line R1 of the detector D2 changes to a low-level(L-level). On the other hand, if the output O2 is at the L-level, since the transistor RT1 now being tested is kept turned off, the output line R1 keeps the H-level. Since the level (H or L) of the output is determined according to the test input signal, it is possible to discriminate whether the cell C2 is defective or not by observing the potential of the output line R1. In this method, since the detector circuits D1 to D4 are added to the respective cells, when the cell size is small in particular, the overhead area is large. Therefore, it is preferable to use the detector circuit in common for each row or column. The test circuit according to the present invention based upon the above-mentioned feature will be described hereinbelow.

Figure 22:
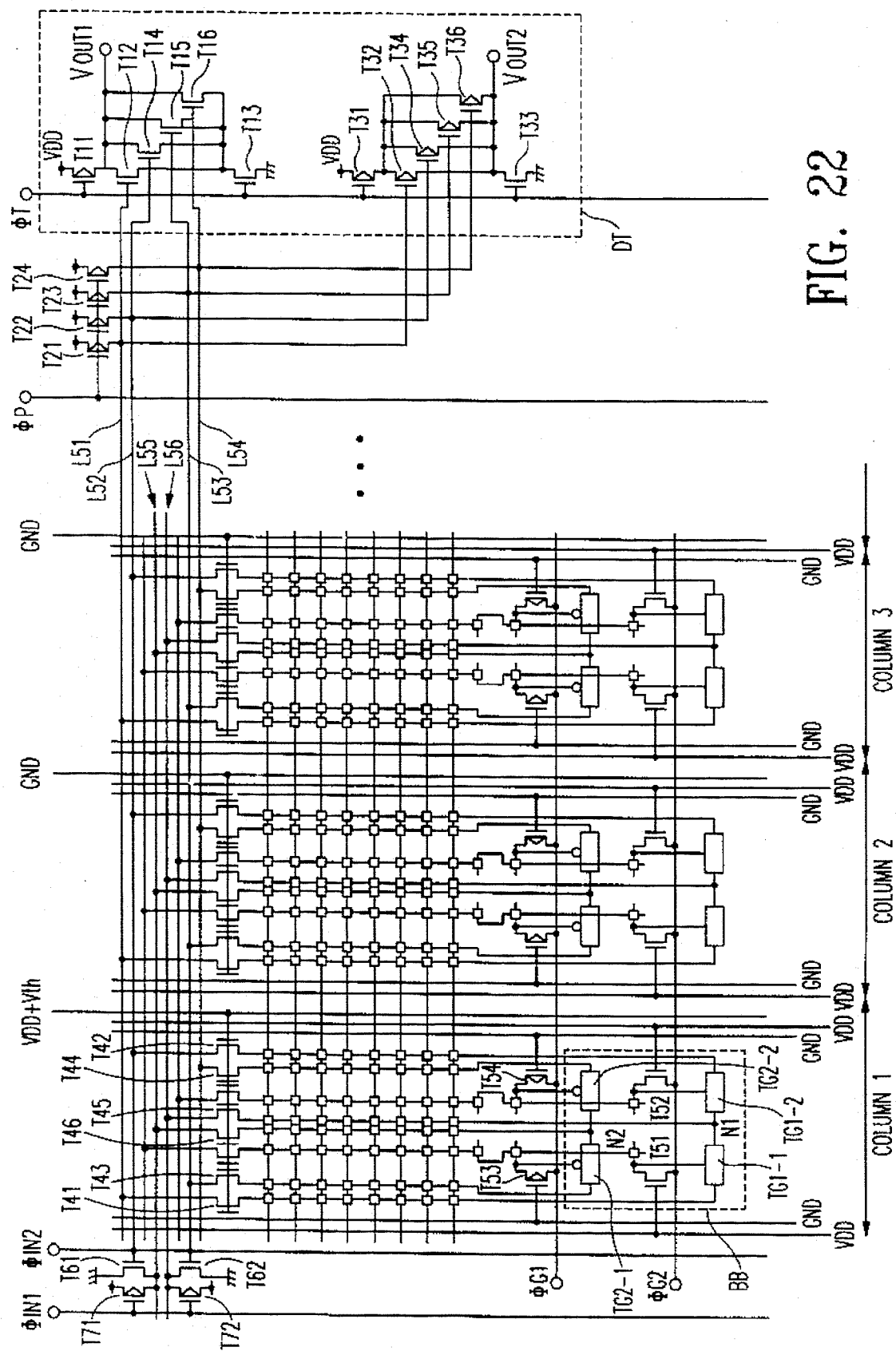
FIG. 22 is a diagram showing an overall configuration of a test circuit for testing the embodiments according to the present invention.

FIG. 22 shows an embodiment of the test circuit according to the present invention. Here, the case where the basic block 6 of the first embodiment is tested will be described. In the drawing, cells for three columns arranged in a row are shown, and the potentials applied to the respective wires when the leftmost cell 1 is selectively tested are shown.

In FIG. 22, a plurality of basic blocks BB are connected to a detector DT via wires L51 to L54. In the circuit shown on the upper side of the detector DT, transistors T11, T12 and T13 are connected in series between a supply potential VDD and a ground potential VSS. The drains of the transistors T11 and T12 are an output Vout1. Transistors T14 to T16 are connected in parallel to the transistor T12. Wires L51 to L54 are connected to the gates of the transistors T12 to T16, respectively. These wires L51 to L54 can be connected to the supply potential through the transistors T21 to T24, respectively.

In the circuit shown on the lower side of the detector DT, transistors T31 to T33 are connected in series between the supply potential and the ground potential. The connected drains of the two transistors T32 and T33 correspond to an output Vout2. Transistors T34 to T36 are connected in parallel to the transistor T32. The gates of the transistors T32 and T34 to T36 are connected to the wires L51 to L54, respectively. A signal $\phi_T$ is applied to the gates of the transistors T11, T13, T31 and T33, respectively. Further, a signal $\phi_P$ is applied to the gates of the transistors T21 to T24, respectively.

The respective wires L51 to L56 are connectable to the respective nodes of the basic block BB through transistors T41 to T46, respectively. A potential (VDD+ $V_{th}$) higher than the supply potential by the threshold voltage $V_{th}$ of these transistors is applied to the gates of these transistors T41 to T46 included in the column 1, so that the potential within the range 0 to VDD can be propagated without dropping the voltage of the threshold value. In this case, the GND potential is given to the gates of other transistors (which correspond to the transistors T41 to T46) of the other basic blocks BB included in the columns other than the column 1, in order to be perfectly disconnected from the detector DT for prevention of the basic cell now being tested from being subjected to the influence of the other basic cells. The GND potential or the supply potential can be applied to the wire L55 through two transistors T61 and T71. The GND potential or the supply potential can be applied also to the wire L56 through two transistors T62 and T72. Further, it is possible to apply signal $\phi_{G1}$ or $\phi_{G2}$ to the gates of the transmission gates TG1-1, TG1-2; TG2-1, TG2-2 of the basic block BB through transistors T51, T52; T53, T54, respectively. The transmission gates TG1-1, TG1-2; TG2-1, TG2-2 are the same as the first and second transmission gates shown in detail in FIGS. 2 and 3, respectively.

The defectiveness and the non-defectiveness of the basic block BB can be discriminated as follows: The intermediate node N1 between the transmission gates TG1-1 and TG1-2 and the intermediate node N2 between the transmission gates TG2-1 and TG2-2 are set to the supply potential VDD or the ground potential GND by use of the transistors T61, T62, T71, T72, T45 and T46. The detector DT checks as to whether there exist no leakage on condition that the transmission gates TG1-1, TG1-2; TG2-1, TG2-2 are all turned off and as to whether the signals can be passed therethrough on condition that the transmission gates are all turned on. These checks can be realized by detecting the levels of the outputs Vout1 and Vout2 determined by the turn-on and -off conditions of the transistors T12, T14 to T16, T32, and T34 to T36.

Figure 23:
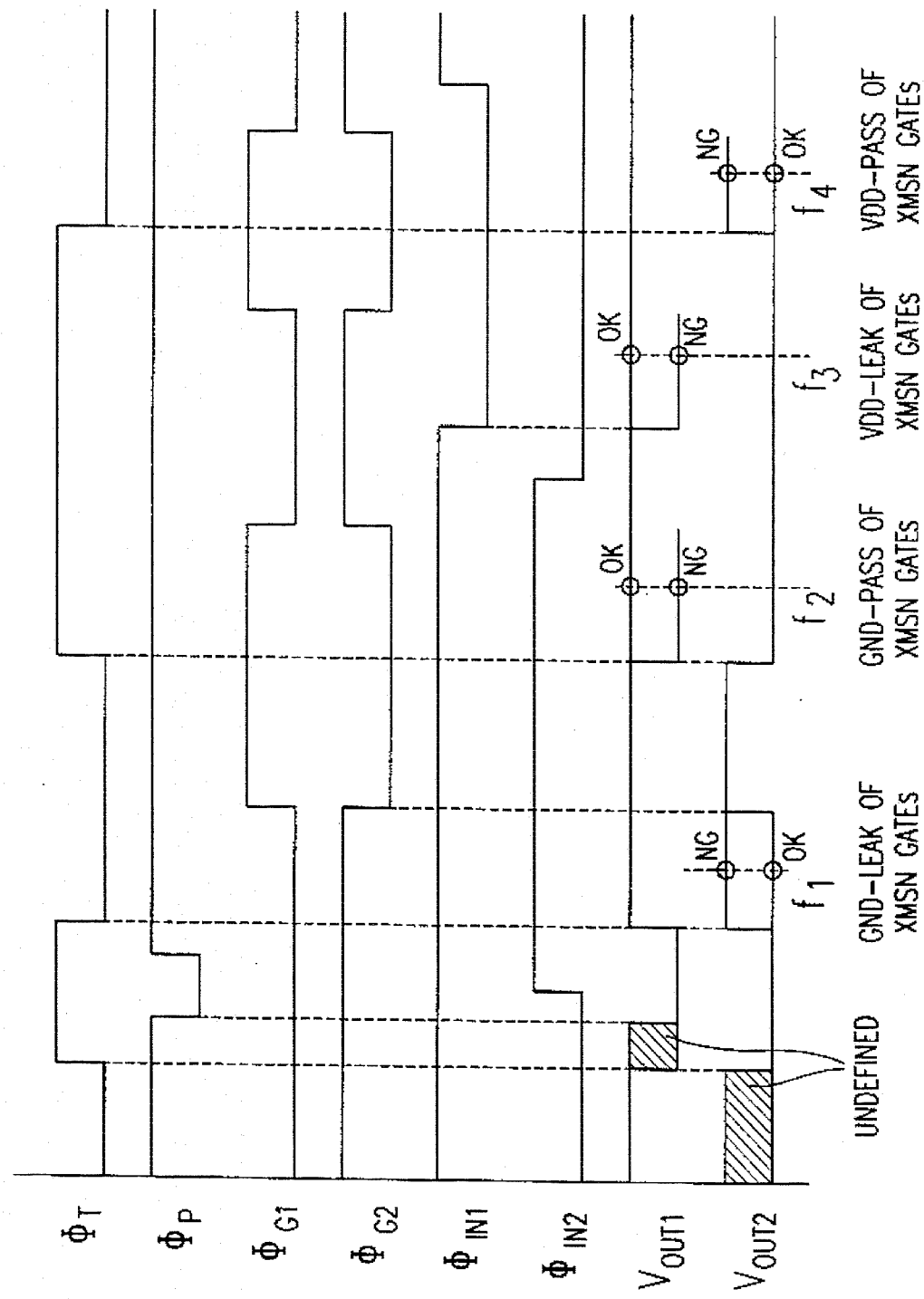
FIG. 23 is a timing chart for assistance in explaining the operation of the test circuit shown in FIG. 22.

FIG. 23 is a timing chart for assistance in explaining how to apply various pulse signals. In more detail, when the transmission gates TG1-1, TG1-2; TG2-1, TG2-2 are turned off at a time point t1, the detector DT discriminates whether the ground potential is not leaked from one of the input and output terminals to the other of the input and output terminals. For this discrimination, voltages for turning off these transmission gates TG1-1, TG1-2; TG2-1, TG2-2 are applied to the gates thereof by use of the transistors T51 to T54, and further the GND potential is applied to the intermediate nodes N1 and N2 of these transmission gates. Under these conditions, the GND potential will not be passed through the transmission gates TG1 and TG2, as far as the transmission gates TG1-1, TG1-2; TG2-1, TG2-2 are non-defective. However, if the transmission gates TG1-1, TG1-2; TG2-1, TG2-2 are defective, the GND potential drops the potential of the wires L51 to L54 below the previously determined supply potential VDD through the transmission gates TG1-1, TG1-2; TG2-1, TG2-2, the potential at the input and output terminals are lowered below the previously determined supply voltage VDD. In other words, it is possible to discriminate whether the transmission gates TG1-1, TG1-2; TG2-1, TG2-2 are non-defective or not by checking whether the GND potential is passed through the transmission gates TG1-1, TG1-2; TG2-1, TG2-2 (not passed if non-defective). The above-mentioned discrimination can be made by observing the potential of the wires L51 to L54 connected to the transmission gates TG1-1, TG1-2; TG2-1, TG2-2 as the output Vout2 of the detector DT. That is, although the potential Vout2 is at the ground potential before the time t1, when the potential of any one of the wires L51 to L54 previously precharged to the supply potential VDD drops below the supply potential due to the defectiveness of any one of the transmission gates TG1-1, TG1-2; TG2-1, TG2-2 (i.e., below the threshold value of the P-type transistors T32 to T36), since the transistor which corresponds to the defective transmission gate is turned on in the transistors T32 to T36, the output potential Vout2 changes to the supply potential VDD at a time t1. Accordingly, it is possible to discriminate that all the transmission gates TG1-1, TG1-2; TG2-1, TG2-2 are normal (non-defective) when the potential Vout2 is kept at the ground potential at the time t1, but that any of the transmission gates is abnormal (defective) when the potential Vout2 changes to the supply potential VDD at the time t1. Further, the discrimination as to whether the VDD potential is passed through the turned-off transmission gates TG1-1, TG1-2; TG2-1, TG2-2 is made at a time point t3 on the basis of the output terminal potential Vout1. Since the principle is the same as with the case of the ground potential, the description thereof is omitted herein. Further, the discrimination of GND pass/VDD pass (as to whether the GND/VDD potential can be passed through the turned-on transmission gates TG1-1, TG1-2; TG2-1, TG2-2) is made at a time point t2/t4. The features of this test method are that the test for one row can be made by a few detectors and that since the detection results can be outputted as voltages, the test time can be shortened. (When current is outputted, since it takes a long time to measure the current, the test time is long.) Since the principle is the same as with the case of the above description, the description thereof is omitted herein.

Further, without being limited to only the above-mentioned description, various modification can be made. For example, the above-mentioned test procedure can be changed in any given sequence. Further, if the precharge potential is the ground potential, n-type FETs must be used as the precharge transistors T21 to T24, instead of the p-type transistors as shown. Further, the wires L51 to L54 can be precharged to any of the supply potential and the ground potential. Further, various modifications may be made within the scope without departing the gist of the present invention.

Another embodiment will be described hereinbelow, by which it is possible to optimize the relationship between the number of the wires and the lengths of the wires when the user can change the wire connections of the integrated circuit.

As well understood by the various embodiments, a first wire group (the first wires) extending from the basic cell is arranged so as to intersect a second wire group (the second wires) in three dimensions. Further, programmable elements are arranged some of the intersectional points between the first and second wires. In this case, when the two basic cells are connected to each other, the user determines which programmable elements must be programmed. As already explained, however, it is practically difficult to provide a sufficient margin to the second wires previously. Consequently, there exists a case where the lengths of the second wires are not sufficient or excessive.

Figure 24:
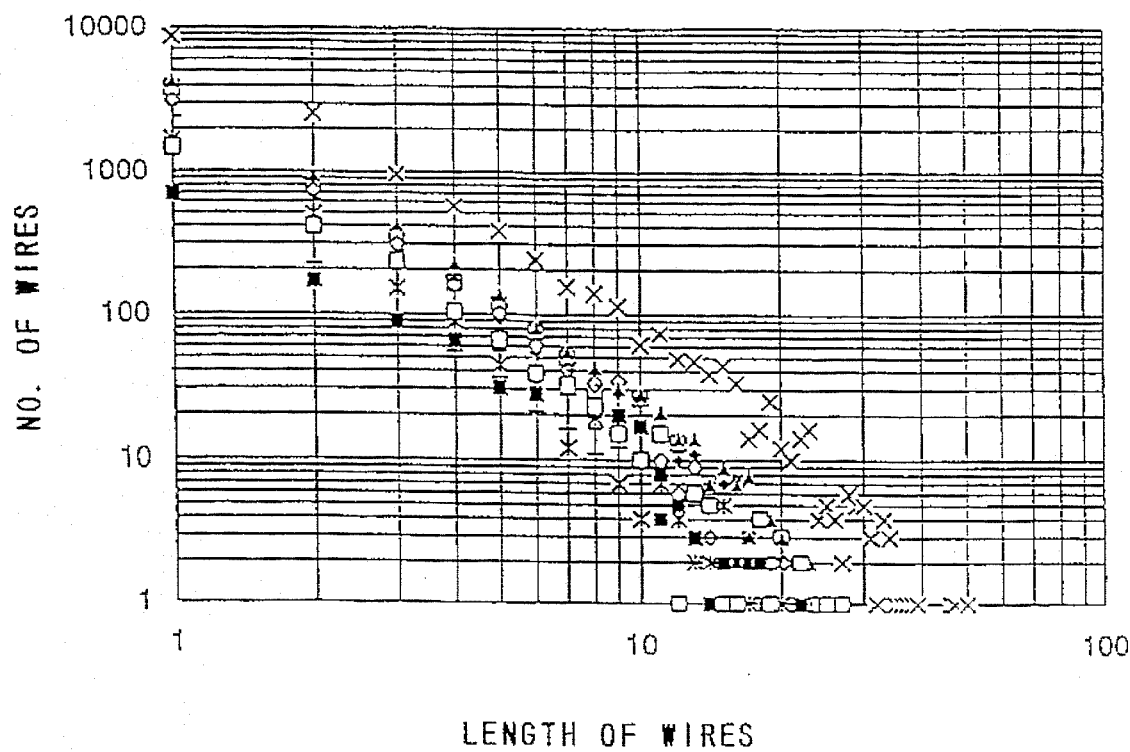
FIG. 24 is a diagram showing the relationship between the interconnection length and the number of wires in an LSI manufactured by use of a gate array.

With these problems in mind, therefore, the inventors have analyzed the wires of the gate arrays and examined the distribution of the wire lengths. FIG. 24 shows a graphical representation of the examined results. This drawing indicates that there exists a power-relationship between the number of wires and the length of the wires. On the basis of the above-mentioned knowledge, the inventors come to the conclusion that the distribution of the numbers of the second wires must be determined in accordance with a function with the wire length as the variable. When the wires are prepared as described above, whenever the user connects the wires by programming the programmable elements, it is possible to provide sufficient wiring resources to be needed and thereby to utilize the chip area more effectively.

Figure 25:
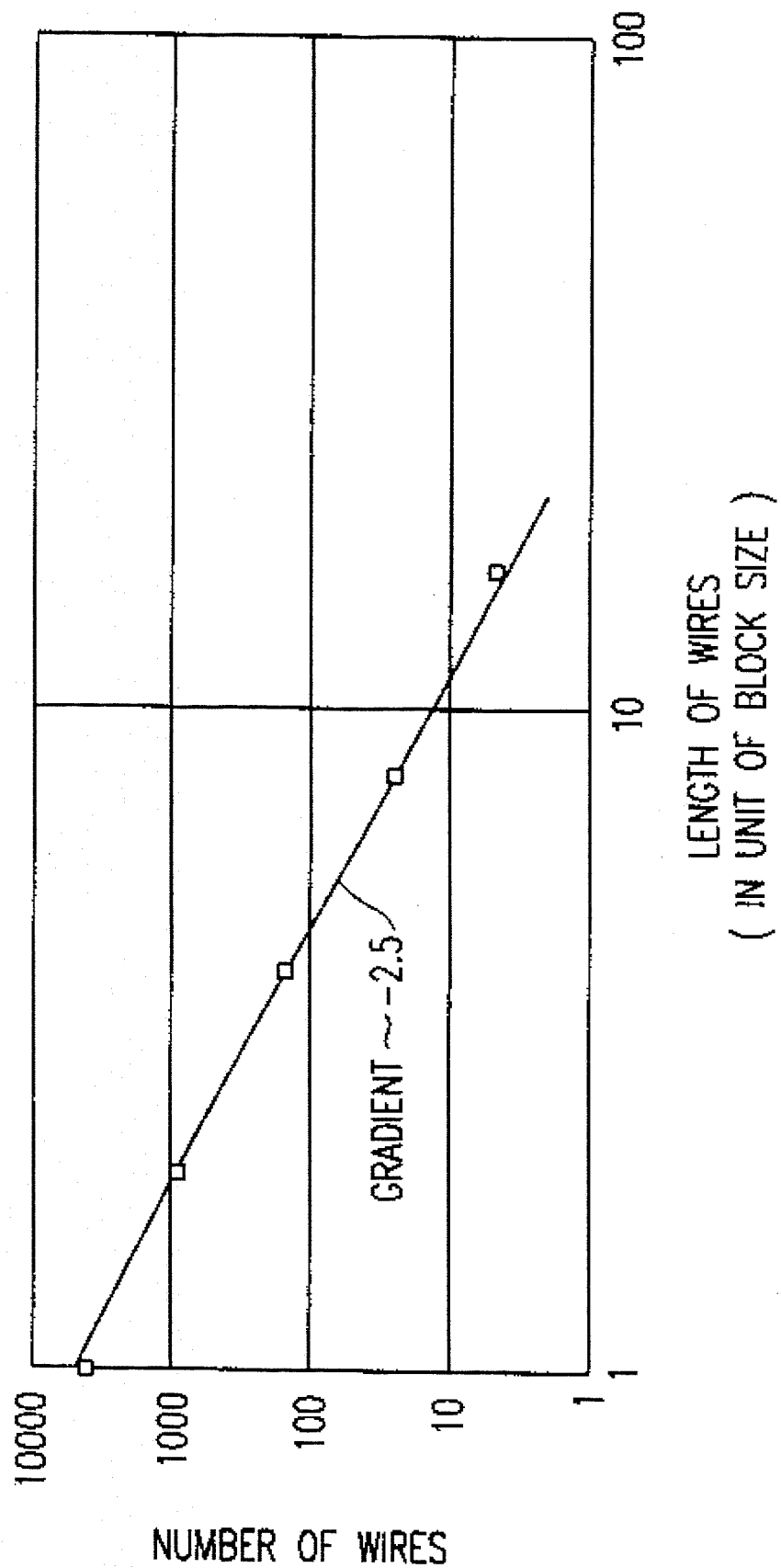
FIG. 25 is a graphical representation showing a distribution of the number of interconnections with respect to the interconnection length, on the basis of which the number of wires can be decided according to the interconnection length in the present invention.
Figure 26:
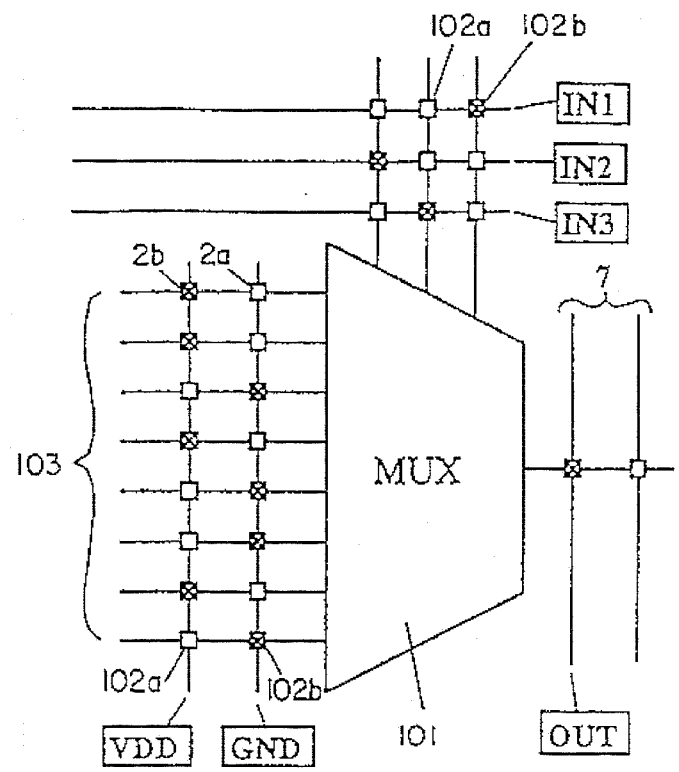
FIG. 26 is a circuit diagram showing the conventional FPGA basic cell using a multi-input multiplexer.

The analysis made by the inventors are as follows:

In the second wires, the number of the wires can be represented by a monotonically decreasing function. That is, the number of the wires with a first length is larger than the number of the wires with a second length longer than this first length, but smaller than the number of wires with a third length shorter than this first length. In more quantitative expression, when the logarithmic values of the lengths of the wires represented by a unit are plotted on an abscissa and further the logarithmic values of the numbers of wires are plotted on an ordinate as shown in FIG. 25, there exists a relationship of $-3 \leq k \leq -2$, where k denotes a gradient of the least square straight line. In the case of the example shown in FIG. 25, the number of the wires changes in reverse proportion to the length of the wires in dependence upon the gradient of −2.5th power. Further, in FIG. 25, the unit length of the wires is a length of one side of the basic cell.

As described above, in the FPGA (field programmable gate array) according to the present invention, it is possible to obtain the FPGA high in both the cell utilization efficiency and the operating speed. Further, it is possible to properly discriminate whether the transmission gates in the basic block are non-defective or not before shipping. Further, it is possible to provide the FPGA sufficient in the wiring resources and high in the chip area utilization efficiency.

What is claimed is:

1. A field programmable gate array, comprising:

a basic block having a first transmission gate turned on in response to a high gate voltage and a second transmission gate turned on in response to a low gate voltage, gates of the first and second transmission gates being connected to each other as a common gate or being connectable to each other as a common gate by switching means when programmed;

first voltage supplying means for selectively supplying any one of high and low voltages to one of input and output terminals of each of the first and second transmission gates of said basic cell, respectively;

determining means for selectively determining turn-on or -off status of each of the first and second transmission gates by compulsorily controlling gate voltages of the first and second transmission gates, respectively; and second voltage supplying means for selectively supplying any one of high and low voltages to the other of the input and output terminals of each of the first and second transmission gates of said basic block, respectively; and discriminating means for discriminating whether voltage at the other of the input and output terminals of each of the first and second transmission gates is high or low, respectively.

2. The field programmable gate array of claim 1, wherein said discriminating means comprises discrimination switching means turned on or off on the basis of the voltages applied to control terminals thereof, respectively.

3. The field programmable gate array of claim 2, wherein said discrimination switching means are interconnected between a high voltage supply and a low voltage supply, respectively.

4. The field programmable gate array of claim 1, wherein said discriminating means comprises first discriminating means for discriminating whether the other of the input and output terminals of each of the first and second transmission gates ground potential or not, respectively and second discriminating means for discriminating whether the other of the input and output terminals of each of the first and second transmission gates is supply potential or not, respectively.

5. The field programmable gate array of claim 4, wherein said first and second discriminating means comprises first and second switching means turned on or off on the basis voltages applied to control terminals thereof, respectively.

6. The field programmable gate array of claim 5, wherein said discrimination switching means are interconnected between a high voltage supply and a low voltage supply, respectively.

7. The field programmable gate array of claim 6, wherein a first switch, said first discriminating switching means, and a second switch are connected in series between the high voltage supply and the low voltage supply, and further a third switch, said second discriminating switching means, a fourth switch are connected in series between the high supply voltage and the low voltage supply.

8. The field programmable gate array of claim 7, wherein said first discrimination switching means are N-channel transistors, a first output of said first discriminating means being outputted between said first discriminating switching means and the first switch; and said second discrimination switching means are P-channel transistors, a second output of said second discriminating means being outputted between said second discriminating switching means and the fourth switch.

9. A semiconductor integrated circuit, comprising:

a plurality of circuit elements;

a plurality of first wires connected to said circuit elements, respectively;

a plurality of second wires for connecting said first wires, respectively; and a plurality of switching means interposed between said first and second wires respectively, for selectively connecting said first and second wires when programmed, the number of said second wires being represented by a monotone decreasing function with respect to the length of said second wires, and dependency of the number of said second wires upon the length thereof lying within a range between −2 power and −3 power of the length thereof.

10. The semiconductor integrated circuit of claim 9, wherein the dependency of the number of said second wires upon the length thereof is −2.5 power of the length thereof.

* * * * *